*(12)* United States Patent
Mow et al.

(10) Patent No.: US 10,826,177 B2
(45) Date of Patent: Nov. 3, 2020

(54) ELECTRONIC DEVICES HAVING PHASED ANTENNA ARRAYS FOR PERFORMING PROXIMITY DETECTION OPERATIONS

(71) Applicant: Apple Inc., Cupertino, CA (US)

(72) Inventors: Matthew A. Mow, Los Altos, CA (US); Rodney A. Gomez Angulo, Santa Clara, CA (US); Harish Rajagopalan, San Jose, CA (US); Simone Paulotto, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 291 days.

(21) Appl. No.: 15/907,029

(22) Filed: Feb. 27, 2018

(65) Prior Publication Data

US 2019/0267709 A1 Aug. 29, 2019

(51) Int. Cl.
*H01Q 3/28* (2006.01)
*G01S 13/04* (2006.01)
*H01Q 1/24* (2006.01)
*H01Q 21/24* (2006.01)
*G01R 29/08* (2006.01)

(52) U.S. Cl.
CPC ............... *H01Q 3/28* (2013.01); *G01R 29/08* (2013.01); *G01S 13/04* (2013.01); *H01Q 1/243* (2013.01); *H01Q 21/24* (2013.01)

(58) Field of Classification Search
CPC combination set(s) only.
See application file for complete search history.

(56) References Cited

U.S. PATENT DOCUMENTS

| | | | |
|---|---|---|---|
| 8,781,420 B2 | 7/2014 | Schlub et al. | |
| 8,947,302 B2 | 2/2015 | Caballero et al. | |
| 9,179,299 B2 | 11/2015 | Schlub et al. | |
| 9,252,492 B2 | 2/2016 | Alrabadi et al. | |
| 9,667,290 B2 * | 5/2017 | Ouyang | H04B 1/1081 |
| 9,784,820 B2 | 10/2017 | Arage | |
| 9,882,282 B2 | 1/2018 | Noori et al. | |
| 2008/0316121 A1 * | 12/2008 | Hobson | H01Q 13/10 343/702 |
| 2014/0078008 A1 * | 3/2014 | Kang | H01Q 5/35 343/702 |

(Continued)

*Primary Examiner* — Mamadou L Diallo
(74) *Attorney, Agent, or Firm* — Treyz Law Group, P.C.; Michael H. Lyons; Matthew R. Williams

(57) ABSTRACT

An electronic device may be provided with wireless circuitry that includes a phased antenna array. The array may include multiple antennas each having multiple antenna feeds for covering different polarizations. Control circuitry may control the wireless circuitry to transmit signals at millimeter or centimeter wave frequencies using a first set of feeds in the array and at least one selected phase. The wireless circuitry may receive the signals transmitted by the first set of feeds using a second set of feeds in the array. The control circuitry may gather phase measurements for the received signals and may compare the phase measurements to the selected phase to generate phase difference values. The control circuitry may perform external object proximity detection operations based on the phase difference values. The control circuitry may control the wireless circuitry to cycle through different combinations of antenna feeds for the first and second sets.

19 Claims, 9 Drawing Sheets

(56) References Cited

U.S. PATENT DOCUMENTS

| | | | |
|---|---|---|---|
| 2017/0005707 A1* | 1/2017 | Islam | H04B 7/0404 |
| 2017/0125889 A1 | 5/2017 | Pascolini et al. | |
| 2017/0256867 A1* | 9/2017 | Ding | H01Q 21/0075 |
| 2017/0290011 A1* | 10/2017 | Kushnir | G01S 7/006 |
| 2017/0309992 A1* | 10/2017 | Noori | H01Q 1/2258 |
| 2018/0026361 A1* | 1/2018 | Sakong | H01Q 1/243 |
| | | | 343/860 |
| 2018/0034134 A1* | 2/2018 | Dalmia | H01Q 5/49 |
| 2018/0159203 A1* | 6/2018 | Baks | H01Q 1/2283 |
| 2019/0020114 A1* | 1/2019 | Paulotto | H01Q 1/521 |
| 2019/0044561 A1* | 2/2019 | Fernando | G01S 13/878 |
| 2019/0167500 A1* | 6/2019 | Baker | A61G 7/0527 |

\* cited by examiner

|  | 96-1V | 96-2V | 96-3V | 96-4V |
|---|---|---|---|---|
| 200 → ΔΦFS | 0 | 20 | 40 | 60 |
| 202 → ΔΦ1 | 0 | 30 | 40 | 60 |
| 204 → ΔΦ1' | 0 | 10 | 0 | 0 |
| 206 → ΔΦ2 | 0 | 40 | 50 | 60 |
| 208 → ΔΦ2' | 0 | 20 | 10 | 0 |

*FIG. 9*

ELECTRONIC DEVICES HAVING PHASED ANTENNA ARRAYS FOR PERFORMING PROXIMITY DETECTION OPERATIONS

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It may be desirable to support wireless communications in millimeter wave and centimeter wave communications bands. Millimeter wave communications, which are sometimes referred to as extremely high frequency (EHF) communications, and centimeter wave communications involve communications at frequencies of about 10-300 GHz. Operation at these frequencies may support high bandwidths, but may raise significant challenges. For example, millimeter wave communications signals generated by antennas can be characterized by substantial attenuation and/or distortion during signal propagation through various mediums. In addition, if care is not taken, external objects in the vicinity of the electronic device may block millimeter wave communications signals in certain directions. Industry or government standards or regulations may also impose limits on the amount of millimeter wave energy that is absorbed by external objects such as the user's body in the vicinity of the electronic device.

It would therefore be desirable to be able to provide electronic devices with improved wireless communications capabilities for supporting communications at frequencies greater than 10 GHz.

SUMMARY

An electronic device may be provided with wireless communications circuitry. The wireless communications circuitry may include antennas arranged in a phased antenna array and transceiver circuitry such as centimeter and millimeter wave transceiver circuitry (e.g., circuitry that transmits and receives radio-frequency signals at frequencies greater than 10 GHz).

The phased antenna array may include multiple antennas each having multiple antenna feeds such as horizontally-polarized antenna feeds and vertically-polarized antenna feeds. Beam steering circuitry such as one or more phase and magnitude controllers may be coupled to the antenna feeds in the phased antenna array. Switching circuitry may be coupled between the transceiver circuitry and the beam steering circuitry. Control circuitry in the electronic device may control the wireless communications circuitry to transmit the radio-frequency signals using a first set of antenna feeds in the phased antenna array with at least one selected phase. The control circuitry may control the wireless communications circuitry to receive the radio-frequency signals transmitted by the first set of antenna feeds using a second set of antenna feeds in the phased antenna array (e.g., the second set of antenna feeds may receive the transmitted radio-frequency signals over-the-air).

Phase measurement circuitry may gather phase measurement values for the radio-frequency signals received by the second set of antenna feeds. The control circuitry may compare the gathered phase measurement values to the at least one selected phase to generate phase difference values between the first and second sets of antenna feeds. The control circuitry may perform external object proximity detection operations based on the phase difference values (e.g., to detect the proximity of an object external to the device such as a user's body, clothing, or other objects). For example, the control circuitry may determine whether differences between the generated phase difference values and calibrated phase difference values stored at the electronic device (e.g., predetermined free space phase difference values) exceed a threshold value.

If the differences between the generated phase difference values and the calibrated phase difference values exceed the threshold value, this may be indicative of an external object in close proximity to the phased antenna array (e.g., within a predetermined distance of the phased antenna array). The control circuitry may subsequently disable the phased antenna array and may switch a different phased antenna array into use. If the differences between the generated phase difference values and the calibrated phase difference values do not exceed the threshold value, this may be indicative of the absence of an external object in close proximity to the phased antenna array. The control circuitry may subsequently increase the transmit power level of the wireless communications circuitry to maximize wireless performance at millimeter and centimeter wave frequencies. The control circuitry may control the wireless communications circuitry to cycle through different combinations of antenna feeds in the first and second sets to characterize phase differences across the entire phased antenna array if desired.

BRIEF DESCRIPTION OF THE DRAWINGS

FIG. 9 is an illustrative table of exemplary phase difference values that may be generated by a phased antenna array in detecting the proximity of external object in accordance with an embodiment.

DETAILED DESCRIPTION

Figure 1:
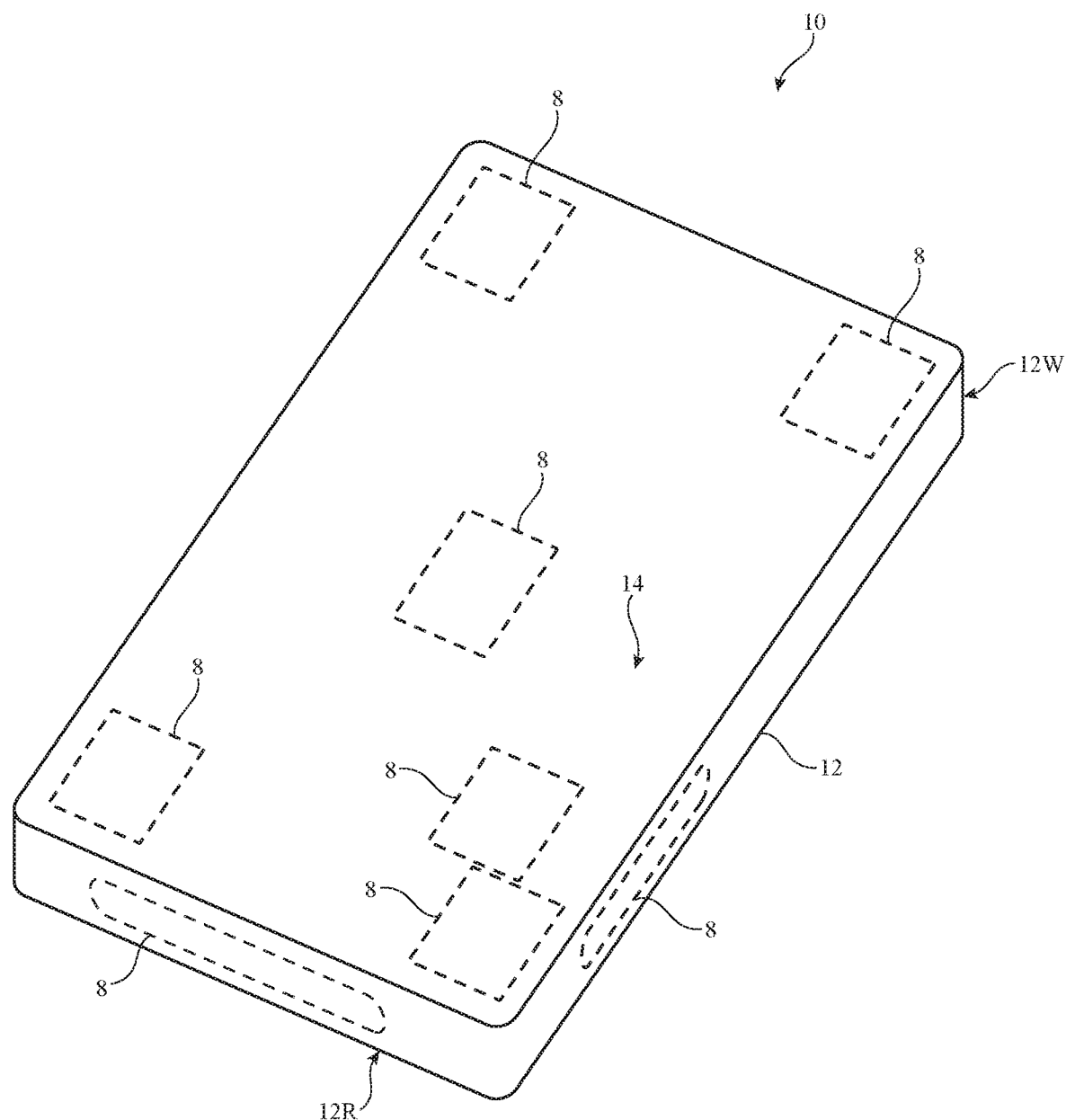
FIG. 1 is a perspective view of an illustrative electronic device with wireless communications circuitry in accordance with an embodiment.

An electronic device such as electronic device 10 of FIG. 1 may contain wireless circuitry. The wireless circuitry may include one or more antennas. The antennas may include phased antenna arrays that are used for handling millimeter wave and centimeter wave communications. Millimeter wave communications, which are sometimes referred to as extremely high frequency (EHF) communications, involve signals at 60 GHz or other frequencies between about 30 GHz and 300 GHz. Centimeter wave communications involve signals at frequencies between about 10 GHz and 30 GHz. If desired, device 10 may also contain wireless communications circuitry for handling satellite navigation system signals, cellular telephone signals, local wireless area network signals, near-field communications, light-based wireless communications, or other wireless communications.

Electronic devices such as device 10 in FIG. 1 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a virtual or augmented reality headset device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless access point or base station (e.g., a wireless router or other equipment for routing communications between other wireless devices and a larger network such as the internet or a cellular telephone network), a desktop computer, a keyboard, a gaming controller, a computer mouse, a mousepad, a trackpad or touchpad, equipment that implements the functionality of two or more of these devices, or other electronic equipment. The above-mentioned examples are merely illustrative. Other configurations may be used for electronic device if desired.

As shown in FIG. 1, device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a planar rear housing wall. If desired, the rear housing wall may have slots that pass entirely through the rear housing wall and that therefore separate housing wall portions of housing 12 from each other. The rear housing wall may include conductive portions and/or dielectric portions. If desired, the rear housing wall may include a planar metal layer covered by a thin layer or coating of dielectric such as glass, plastic, sapphire, or ceramic. Housing 12 (e.g., the rear housing wall, sidewalls, etc.) may also have shallow grooves that do not pass entirely through housing 12. The slots and grooves may be filled with plastic or other dielectric. If desired, portions of housing 12 that have been separated from each other (e.g., by a through slot) may be joined by internal conductive structures (e.g., sheet metal or other metal members that bridge the slot).

Display 14 may include pixels formed from light-emitting diodes (LEDs), organic LEDs (OLEDs), plasma cells, electrowetting pixels, electrophoretic pixels, liquid crystal display (LCD) components, or other suitable pixel structures. A display cover layer such as a layer of clear glass or plastic may cover the surface of display 14 or the outermost layer of display 14 may be formed from a color filter layer, thin-film transistor layer, or other display layer. Display 14 may contain an active area with an array of pixels (e.g., a central substantially rectangular portion). Inactive areas of the display that are free of pixels may form borders for the active area. If desired, the active area of display 14 may extend across some or all (e.g., substantially all) of the lateral front face of device 10 (e.g., from the left edge to the right edge and from the bottom edge to the top edge of the front face of device 10).

Housing 12 may include peripheral housing structures 12W. Peripheral housing structures 12W may run around the periphery of device 10 and display 14. In configurations in which device 10 and display 14 have a rectangular shape with four edges, peripheral housing structures 12W may be implemented using peripheral housing structures that have a rectangular ring shape with four corresponding edges (as an example). Peripheral housing structures 12W or part of peripheral housing structures 12W may serve as a bezel for display 14 (e.g., a cosmetic trim that surrounds all four sides of display 14 and/or that helps hold display 14 to device 10). Peripheral housing structures 12W may, if desired, form sidewall structures for device 10 (e.g., by forming a metal band with vertical sidewalls, curved sidewalls, etc.).

Peripheral housing structures 12W may be formed of a conductive material such as metal and may therefore sometimes be referred to as peripheral conductive housing structures, conductive housing structures, peripheral metal structures, or a peripheral conductive housing member (as examples). Peripheral conductive housing structures 12W may be formed from a metal such as stainless steel, aluminum, or other suitable materials. One, two, or more than two separate structures may be used in forming peripheral conductive housing structures 12W.

It is not necessary for peripheral conductive housing structures 12W to have a uniform cross-section. For example, the top portion of peripheral conductive housing structures 12W may, if desired, have an inwardly protruding lip that helps hold display 14 in place. The bottom portion of peripheral conductive housing structures 12W may also have an enlarged lip (e.g., in the plane of the rear surface of device 10). Peripheral conductive housing structures 12W may have substantially straight vertical sidewalls, may have sidewalls that are curved, or may have other suitable shapes. In some configurations (e.g., when peripheral conductive housing structures 12W serve as a bezel for display 14), the peripheral conductive housing structures may run around the lip of housing 12 (i.e., the peripheral conductive housing structures may cover only the edge of housing 12 that surrounds display 14 and not the rest of the sidewalls of housing 12).

If desired, housing 12 may have a conductive rear surface or wall such as wall 12R (sometimes referred to herein as conductive rear housing wall 12R). For example, housing 12 may be formed from a metal such as stainless steel or aluminum. The rear surface of housing 12 may lie in a plane that is parallel to display 14. In configurations for device 10 in which the rear surface of housing 12 is formed from metal, it may be desirable to form parts of peripheral conductive housing structures 12W as integral portions of the housing structures forming the rear surface of housing 12. For example, conductive rear housing wall 12R may be formed from a planar metal structure and portions of peripheral conductive housing structures 12W on the sides of housing 12 may be formed as flat or curved vertically extending integral metal portions of the planar metal structure. Housing structures such as these may, if desired, be machined from a block of metal and/or may include multiple metal pieces that are assembled together to form housing 12. Conductive rear housing wall 12R may have one or more, two or more, or three or more portions. Peripheral conductive housing structures 12W and/or conductive rear housing wall 12R may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating layers that may include dielectric materials such as glass, ceramic, plastic, or other structures that form the exterior surfaces of device 10 and/or serve to hide peripheral conductive housing structures 12W and/or conductive rear housing wall 12R from view of the user).

One or more antennas may be mounted within device 10 at one or more locations such as locations 8 shown in FIG. 1. Locations 8 may include, for example, locations at the corners of housing 12, locations at or near the center of display 14, locations along the peripheral edges of housing 12, locations along peripheral conductive housing structures 12W, locations on conductive rear housing wall 12R, locations between the peripheral edges of housing 12 and the center of display 14, locations under the display cover glass or other dielectric display cover layer that is used in covering and protecting display 14 on the front of device 10, locations under a dielectric window on a rear face of housing 12 or the edge of housing 12, or elsewhere in device 10. In general, it may be desirable for antennas within housing 12 to be able to cover a full sphere around device 10 (e.g., so that device 10 can maintain satisfactory wireless communications with external equipment regardless of the orientation of device 10 with respect to the external equipment). Different arrays of multiple antennas may be mounted at respective locations on device 10 such as respective locations 8 or different antennas in a single array may be mounted at separate locations 8 if desired. If care is not taken, external objects such as the body of a user of device 10 or other objects external to device 10 may block antennas within housing 12 from covering a full sphere around device 10.

Figure 2:
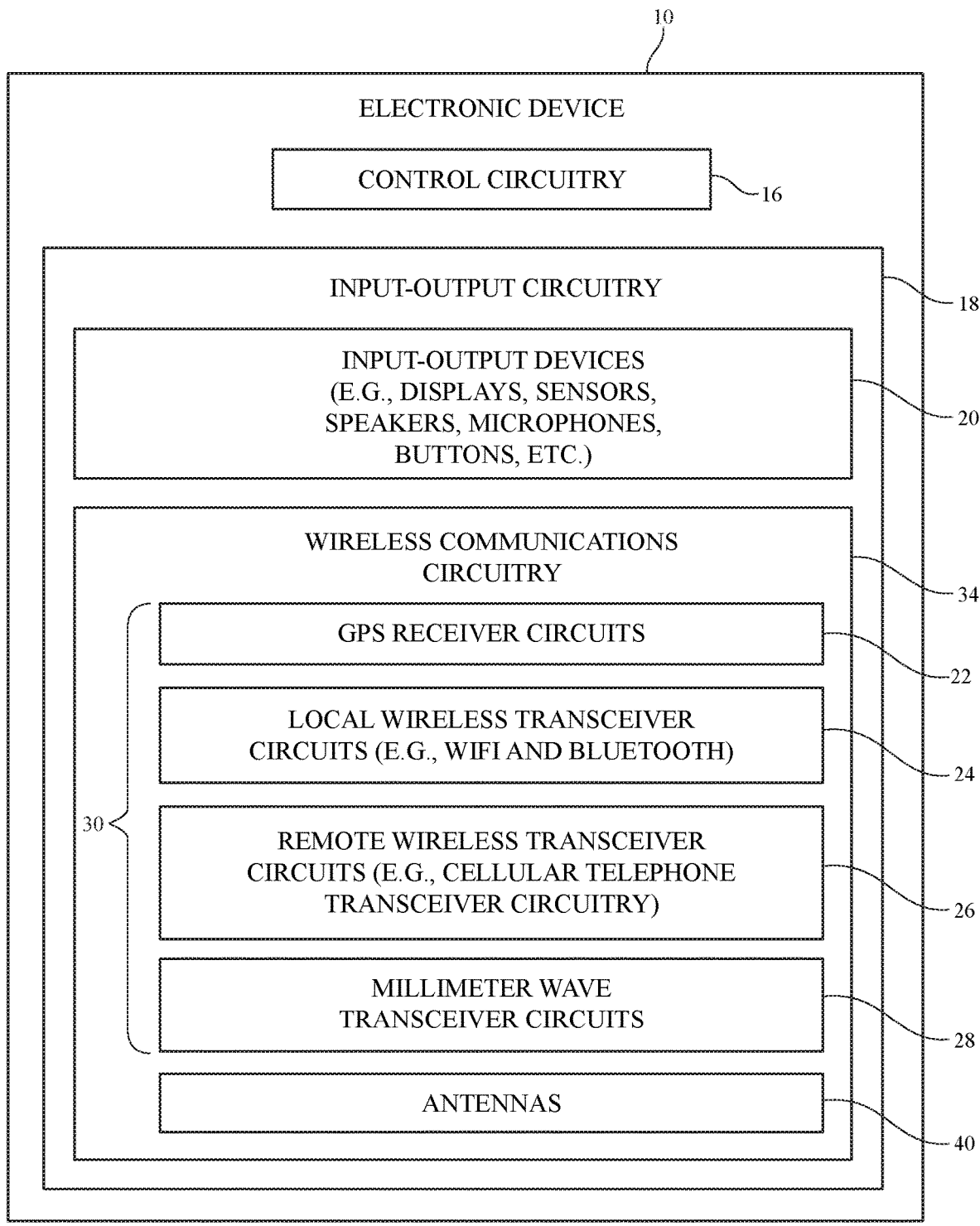
FIG. 2 is a schematic diagram of an illustrative electronic device with wireless communications circuitry in accordance with an embodiment.

A schematic diagram showing illustrative components that may be used in an electronic device such as electronic device 10 is shown in FIG. 2. As shown in FIG. 2, device 10 may include storage and processing circuitry such as control circuitry 16. Control circuitry 16 may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in control circuitry 16 may be used to control the operation of device 10. This processing circuitry may be based on one or more microprocessors, microcontrollers, digital signal processors, baseband processor integrated circuits, application specific integrated circuits, etc.

Control circuitry 16 may be used to run software on device 10, such as internet browsing applications, voice-over-internet-protocol (VOIP) telephone call applications, email applications, media playback applications, operating system functions, etc. To support interactions with external equipment, control circuitry 16 may be used in implementing communications protocols. Communications protocols that may be implemented using control circuitry 16 include internet protocols, wireless local area network protocols (e.g., IEEE 802.11 protocols—sometimes referred to as WiFi®), protocols for other short-range wireless communications links such as the Bluetooth® protocol or other wireless personal area network protocols, IEEE 802.11ad protocols, cellular telephone protocols, MIMO protocols, antenna diversity protocols, satellite navigation system protocols, etc.

Device 10 may include input-output circuitry 18. Input-output circuitry 18 may include input-output devices 20. Input-output devices 20 may be used to allow data to be supplied to device 10 and to allow data to be provided from device 10 to external devices. Input-output devices 20 may include user interface devices, data port devices, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components.

Input-output circuitry 18 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas 40, transmission lines, and other circuitry for handling RF wireless signals. Wireless signals can also be sent using light (e.g., using infrared communications).

Wireless communications circuitry 34 may include radio-frequency transceiver circuitry 30 for handling various radio-frequency communications bands. For example, circuitry 34 may include transceiver circuitry 22, 24, 26, and 28.

Transceiver circuitry 24 may be wireless local area network transceiver circuitry. Transceiver circuitry 24 may handle 2.4 GHz and 5 GHz bands for WiFi® (IEEE 802.11) communications or other wireless local area network (WLAN) bands and may handle the 2.4 GHz Bluetooth® communications band or other wireless personal area network (WPAN) bands.

Circuitry 34 may use cellular telephone transceiver circuitry 26 for handling wireless communications in frequency ranges such as a low communications band from 600 to 960 MHz, a midband from 1710 to 2170 MHz, a high band from 2300 to 2700 MHz, an ultra-high band from 3400 to 3700 MHz, or other communications bands between 600 MHz and 4000 MHz or other suitable frequencies (as examples). Circuitry 26 may handle voice data and non-voice data.

Millimeter wave transceiver circuitry 28 (sometimes referred to as extremely high frequency (EHF) transceiver circuitry 28 or transceiver circuitry 28) may support communications at frequencies between about 10 GHz and 300 GHz. For example, transceiver circuitry 28 may support communications in Extremely High Frequency (EHF) or millimeter wave communications bands between about 30

GHz and 300 GHz and/or in centimeter wave communications bands between about 10 GHz and 30 GHz (sometimes referred to as Super High Frequency (SHF) bands). As examples, transceiver circuitry 28 may support communications in an IEEE K communications band between about 18 GHz and 27 GHz, a $K_a$ communications band between about 26.5 GHz and 40 GHz, a Ku communications band between about 12 GHz and 18 GHz, a V communications band between about 40 GHz and 75 GHz, a W communications band between about 75 GHz and 110 GHz, or any other desired frequency band between approximately 10 GHz and 300 GHz. If desired, circuitry 28 may support IEEE 802.11ad communications at 60 GHz and/or 5th generation mobile networks or 5th generation wireless systems (5G) communications bands between 27 GHz and 90 GHz. If desired, circuitry 28 may support communications at multiple frequency bands between 10 GHz and 300 GHz such as a first band from 27.5 GHz to 28.5 GHz, a second band from 37 GHz to 41 GHz, and a third band from 57 GHz to 71 GHz, or other communications bands between 10 GHz and 300 GHz. Circuitry 28 may be formed from one or more integrated circuits (e.g., multiple integrated circuits mounted on a common printed circuit in a system-in-package device, one or more integrated circuits mounted on different substrates, etc.). While circuitry 28 is sometimes referred to herein as millimeter wave transceiver circuitry 28, millimeter wave transceiver circuitry 28 may handle communications at any desired communications bands at frequencies between 10 GHz and 300 GHz (e.g., transceiver circuitry 28 may transmit and receive radio-frequency signals in millimeter wave communications bands, centimeter wave communications bands, etc.).

Wireless communications circuitry 34 may include satellite navigation system circuitry such as Global Positioning System (GPS) receiver circuitry 22 for receiving GPS signals at 1575 MHz or for handling other satellite positioning data (e.g., GLONASS signals at 1609 MHz). Satellite navigation system signals for receiver 22 are received from a constellation of satellites orbiting the earth.

In satellite navigation system links, cellular telephone links, and other long-range links, wireless signals are typically used to convey data over thousands of feet or miles. In WiFi® and Bluetooth® links at 2.4 and 5 GHz and other short-range wireless links, wireless signals are typically used to convey data over tens or hundreds of feet. Millimeter wave transceiver circuitry 28 may convey signals that travel (over short distances) between a transmitter and a receiver over a line-of-sight path. To enhance signal reception for millimeter and centimeter wave communications, phased antenna arrays and beam steering techniques may be used (e.g., schemes in which antenna signal phase and/or magnitude for each antenna in an array is adjusted to perform beam steering). Antenna diversity schemes may also be used to ensure that the antennas that have become blocked or that are otherwise degraded due to the operating environment of device 10 can be switched out of use and higher-performing antennas used in their place.

Wireless communications circuitry 34 can include circuitry for other short-range and long-range wireless links if desired. For example, wireless communications circuitry 34 may include circuitry for receiving television and radio signals, paging system transceivers, near field communications (NFC) circuitry, etc.

Antennas 40 in wireless communications circuitry 34 may be formed using any suitable antenna types. For example, antennas 40 may include antennas with resonating elements that are formed from loop antenna structures, patch antenna structures, stacked patch antenna structures, antenna structures having parasitic elements, inverted-F antenna structures, slot antenna structures, planar inverted-F antenna structures, monopoles, dipoles, helical antenna structures, Yagi (Vagi-Uda) antenna structures, surface integrated waveguide structures, hybrids of these designs, etc. If desired, one or more of antennas 40 may be cavity-backed antennas. Different types of antennas may be used for different bands and combinations of bands. For example, one type of antenna may be used in forming a local wireless link antenna and another type of antenna may be used in forming a remote wireless link antenna. Dedicated antennas may be used for receiving satellite navigation system signals or, if desired, antennas 40 can be configured to receive both satellite navigation system signals and signals for other communications bands (e.g., wireless local area network signals and/or cellular telephone signals). Antennas 40 can be arranged in phased antenna arrays for handling millimeter wave communications.

Transmission line paths may be used to route antenna signals within device 10 (e.g., signals that are transmitted or received over-the-air by antennas 40). For example, transmission line paths may be used to couple antennas 40 to transceiver circuitry 30. Transmission line paths in device 10 may include coaxial cable paths, microstrip transmission lines, stripline transmission lines, edge-coupled microstrip transmission lines, edge-coupled stripline transmission lines, waveguide structures for conveying signals at millimeter wave frequencies (e.g., coplanar waveguides or grounded coplanar waveguides), transmission lines formed from combinations of transmission lines of these types, etc.

Transmission line paths in device 10 may be integrated into rigid and/or flexible printed circuit boards if desired. In one suitable arrangement, transmission line paths in device 10 may include transmission line conductors (e.g., signal and/or ground conductors) that are integrated within multi-layer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive). Filter circuitry, switching circuitry, impedance matching circuitry, and other circuitry may be interposed within the transmission lines, if desired.

Device 10 may contain multiple antennas 40. The antennas may be used together or one of the antennas may be switched into use while other antenna(s) are switched out of use. If desired, control circuitry 16 may be used to select an optimum antenna to use in device 10 in real time and/or to select an optimum setting for adjustable wireless circuitry associated with one or more of antennas 40. Antenna adjustments may be made to tune antennas to perform in desired frequency ranges, to perform beam steering with a phased antenna array, and to otherwise optimize antenna performance. Sensors may be incorporated into antennas 40 to gather sensor data in real time that is used in adjusting antennas 40 if desired.

In some configurations, antennas 40 may include antenna arrays such as phased antenna arrays that implement beam steering functions. For example, the antennas that are used in handling millimeter wave and centimeter wave signals for transceiver circuitry 28 may be implemented in one or more phased antenna arrays. The radiating elements in a phased antenna array for supporting millimeter wave and centimeter wave communications may be patch antennas, dipole antennas, Yagi (Yagi-Uda) antennas, or other suitable antennas. Transceiver circuitry 28 can be integrated with the phased antenna arrays to form integrated phased antenna array and transceiver circuit modules or packages if desired.

In devices such as handheld devices, the presence of an external object such as the hand of a user or a table or other surface on which a device is resting has a potential to block wireless signals such as millimeter wave signals. In addition, millimeter wave communications typically require a line of sight between antennas 40 and the antennas on an external device. Accordingly, it may be desirable to incorporate multiple phased antenna arrays into device 10, each of which is placed in a different location within or on device 10 (e.g., at different locations such as locations 8 of FIG. 1 or other locations). With this type of arrangement, an unblocked phased antenna array may be switched into use and, once switched into use, the phased antenna array may use beam steering to optimize wireless performance. Similarly, if a phased antenna array does not face or have a line of sight to an external device, another phased antenna array that has line of sight to the external device may be switched into use and that phased antenna array may use beam steering to optimize wireless performance. Configurations in which antennas from one or more different locations in device 10 are operated together may also be used (e.g., to form a phased antenna array, etc.).

Figure 3:
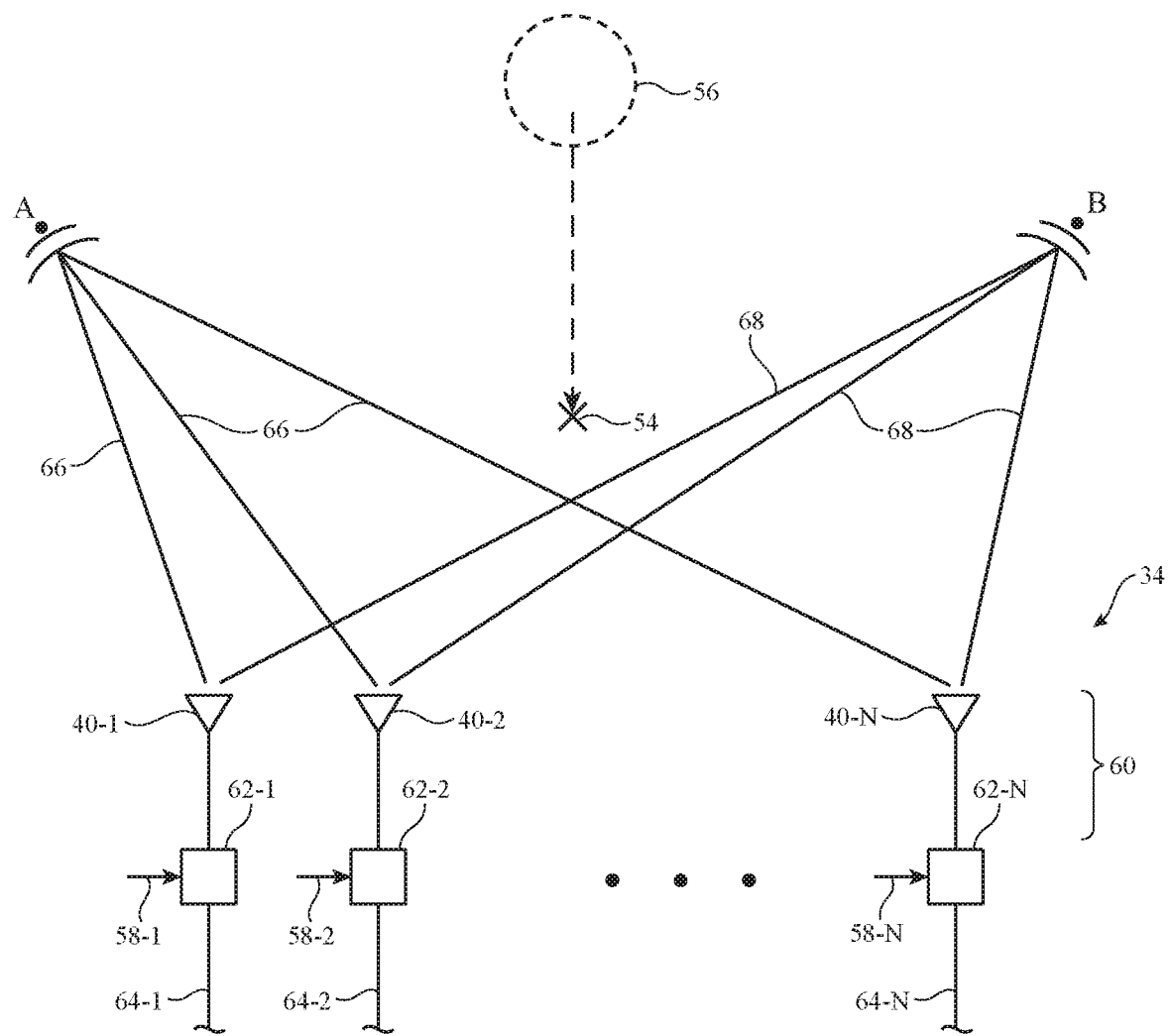
FIG. 3 is a diagram of an illustrative phased antenna array that may be adjusted using control circuitry to direct a beam of signals in accordance with an embodiment.

FIG. 3 shows how antennas 40 on device 10 may be formed in a phased antenna array. As shown in FIG. 3, phased antenna array 60 (sometimes referred to herein as array 60, antenna array 60, or array 60 of antennas 40) may be coupled to signal paths such as transmission line paths 64 (e.g., one or more radio-frequency transmission lines). For example, a first antenna 40-1 in phased antenna array 60 may be coupled to a first transmission line path 64-1, a second antenna 40-2 in phased antenna array 60 may be coupled to a second transmission line path 64-2, an Nth antenna 40-N in phased antenna array 60 may be coupled to an Nth transmission line path 64-N, etc.

Antennas 40 in phased antenna array 60 may be arranged in any desired number of rows and columns or in any other desired pattern (e.g., the antennas need not be arranged in a grid pattern having rows and columns). During signal transmission operations, transmission line paths 64 may be used to supply signals (e.g., radio-frequency signals such as millimeter wave and/or centimeter wave signals) from transceiver circuitry 28 (FIG. 2) to phased antenna array 60 for wireless transmission to external wireless equipment. During signal reception operations, transmission line paths 64 may be used to convey signals received at phased antenna array 60 from external equipment to transceiver circuitry 28 (FIG. 2).

The use of multiple antennas 40 in phased antenna array 60 allows beam steering arrangements to be implemented by controlling the relative phases and magnitudes (amplitudes) of the radio-frequency signals conveyed by the antennas. In the example of FIG. 3, antennas 40 each have a corresponding radio-frequency phase and magnitude controller 62 (e.g., a first phase and magnitude controller 62-1 interposed on transmission line path 64-1 may control phase and magnitude for radio-frequency signals handled by antenna 40-1, a second phase and magnitude controller 62-2 interposed on transmission line path 64-2 may control phase and magnitude for radio-frequency signals handled by antenna 40-2, an Nth phase and magnitude controller 62-N interposed on transmission line path 64-N may control phase and magnitude for radio-frequency signals handled by antenna 40-N, etc.).

Phase and magnitude controllers 62 may each include circuitry for adjusting the phase of the radio-frequency signals on transmission line paths 64 (e.g., phase shifter circuits) and/or circuitry for adjusting the magnitude of the radio-frequency signals on transmission line paths 64 (e.g., power amplifier and/or low noise amplifier circuits). Phase and magnitude controllers 62 may sometimes be referred to collectively herein as beam steering circuitry (e.g., beam steering circuitry that steers the beam of radio-frequency signals transmitted and/or received by phased antenna array 60).

Phase and magnitude controllers 62 may adjust the relative phases and/or magnitudes of the transmitted signals that are provided to each of the antennas in phased antenna array 60 and may adjust the relative phases and/or magnitudes of the received signals that are received by phased antenna array 60 from external equipment. Phase and magnitude controllers 62 may, if desired, include phase detection circuitry for detecting the phases of the received signals that are received by phased antenna array 60 from external equipment. The term "beam" or "signal beam" may be used herein to collectively refer to wireless signals that are transmitted and received by phased antenna array 60 in a particular direction. The term "transmit beam" may sometimes be used herein to refer to wireless radio-frequency signals that are transmitted in a particular direction whereas the term "receive beam" may sometimes be used herein to refer to wireless radio-frequency signals that are received from a particular direction.

If, for example, phase and magnitude controllers 62 are adjusted to produce a first set of phases and/or magnitudes for transmitted millimeter wave signals, the transmitted signals will form a millimeter wave frequency transmit beam as shown by beam 66 of FIG. 3 that is oriented in the direction of point A. If, however, phase and magnitude controllers 62 are adjusted to produce a second set of phases and/or magnitudes for the transmitted millimeter wave signals, the transmitted signals will form a millimeter wave frequency transmit beam as shown by beam 68 that is oriented in the direction of point B. Similarly, if phase and magnitude controllers 62 are adjusted to produce the first set of phases and/or magnitudes, wireless signals (e.g., millimeter wave signals in a millimeter wave frequency receive beam) may be received from the direction of point A as shown by beam 66. If phase and magnitude controllers 62 are adjusted to produce the second set of phases and/or magnitudes, signals may be received from the direction of point B, as shown by beam 68.

Each phase and magnitude controller 62 may be controlled to produce a desired phase and/or magnitude based on a corresponding control signal 58 received from control circuitry 16 of FIG. 2 or other control circuitry in device 10 (e.g., the phase and/or magnitude provided by phase and magnitude controller 62-1 may be controlled using control signal 58-1, the phase and/or magnitude provided by phase and magnitude controller 62-2 may be controlled using control signal 58-2, etc.). If desired, control circuitry 16 may actively adjust control signals 58 in real time to steer the transmit or receive beam in different desired directions over time. Phase and magnitude controllers 62 may provide information identifying the phase of received signals to control circuitry 16 if desired.

When performing millimeter or centimeter wave communications, radio-frequency signals are conveyed over a line of sight path between phased antenna array 60 and external equipment. If the external equipment is located at location A of FIG. 3, phase and magnitude controllers 62 may be adjusted to steer the signal beam towards direction A. If the external equipment is located at location B, phase and magnitude controllers 62 may be adjusted to steer the signal beam towards direction B. In the example of FIG. 3, beam steering is shown as being performed over a single degree of freedom for the sake of simplicity (e.g., towards the left and right on the page of FIG. 3). However, in practice, the beam is steered over two or more degrees of freedom (e.g., in three dimensions, into and out of the page and to the left and right on the page of FIG. 3).

During communications, an external object such as external object 56 may be present in the vicinity of device 10. External object 56 may, for example, be a part of a user's body or clothing, a desktop, table, or other furniture, or other types of object external to device 10. As external object 56 moves within a particular distance of phased antenna array 60 such as to a location 54, external object 56 may block radio-frequency signals handled by phased antenna array 60. In some scenarios, phased antenna array 60 may steer the beam of radio-frequency signals around external object 56 so that object 56 no longer blocks the beam. However, if object 56 is relatively large or if object external 56 moves too close to phased antenna array 60, phased antenna array 60 may be unable to steer around external object 56.

In addition, government regulations or industry standards may impose limits on emitted radiation levels from devices such as device 10. These regulations or standards, which may include specific absorption rate (SAR) standards or other standards, impose maximum energy absorption limits or maximum power density limits on devices that are used in the vicinity of a user's body. Millimeter wave signals handled by phased antenna array 60 typically involve relatively high transmit power levels in order to maintain a satisfactory wireless link quality over a line of sight. When a user's body (e.g., external object 56 of FIG. 3) approaches within a particular distance of phased antenna array 60 (e.g., at location 54), external object 56 may undesirably absorb more wireless energy than is otherwise permitted by the maximum energy absorption or maximum power density limits. There is therefore a tension between ensuring adequate wireless performance and satisfying industry or government standards.

In order to satisfy these standards without sacrificing wireless performance, device 10 may steer the beam away from external object 56 or may switch a different phased antenna array into use (e.g., a phased antenna array located at a different location 8 as shown in FIG. 1) when external object 56 is near to phased antenna array 60. Electronic device 10 may use sensor circuitry in input-output devices 20 of FIG. 2 (e.g., capacitive proximity sensor circuitry, light sensor circuitry, image sensor circuitry, etc.) to detect the presence of external object 56 if desired. However, in practice, detecting external object 56 using these sensors may consume excessive processing resources in device 10, may require additional hardware that consumes valuable real estate in device 10, and/or may have limited external object detection accuracy. If desired, phased antenna array 60 may perform external object proximity detection to detect whether external objects such as external object 56 of FIG. 3 are adjacent to phased antenna array 60 (e.g., to detect whether external object 56 has moved within a predetermined distance of phased antenna array 60 such as at location 54). For example, phased antenna array 60 may detect the proximity of external object 56 by transmitting radio-frequency signals using a first set of the antennas 40 in phased antenna array 60 and receiving the transmitted radio-frequency signals using a second set of the antennas 40 in phased antenna array 60. The transmitted and received radio-frequency signals may be processed by control circuitry 16 (FIG. 2) to determine the proximity of external object 56 relative to phased antenna array 60.

Figure 4:
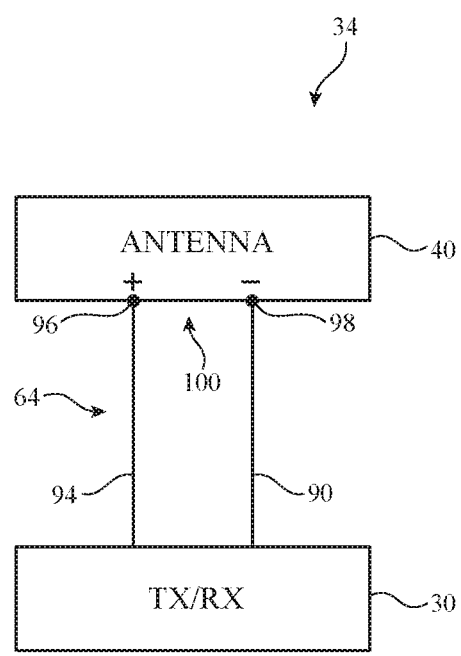
FIG. 4 is a diagram of an illustrative transceiver and antenna in accordance with an embodiment.

A schematic diagram of an antenna 40 that may be formed in phased antenna array 60 (e.g., as antenna 40-1, 40-2, 40-3, and/or 40-N in phased antenna array 60) is shown in FIG. 4. As shown in FIG. 4, antenna 40 may be coupled to transceiver circuitry 30 (e.g., transceiver circuitry 28 of FIG. 2). Transceiver circuitry 30 may be coupled to antenna feed 100 of antenna 40 using transmission line path 64. Antenna feed 100 may include a positive antenna feed terminal such as positive antenna teed terminal 96 and may include a ground antenna feed terminal such as ground antenna feed terminal 98. Transmission line path 64 may include a positive transmission line signal path such as path 94 that is coupled to terminal 96 and a ground transmission line signal path such as path 90 that is coupled to terminal 98.

Any desired antenna structures may be used for implementing antenna 40. In one suitable arrangement that is sometimes described herein as an example, patch antenna structures may be used for implementing antenna 40. Antennas 40 that are implemented using patch antenna structures may sometimes be referred to herein as patch antennas. An illustrative patch antenna that may be used in phased antenna array 60 of FIG. 3 is shown in FIG. 5.

Figure 5:
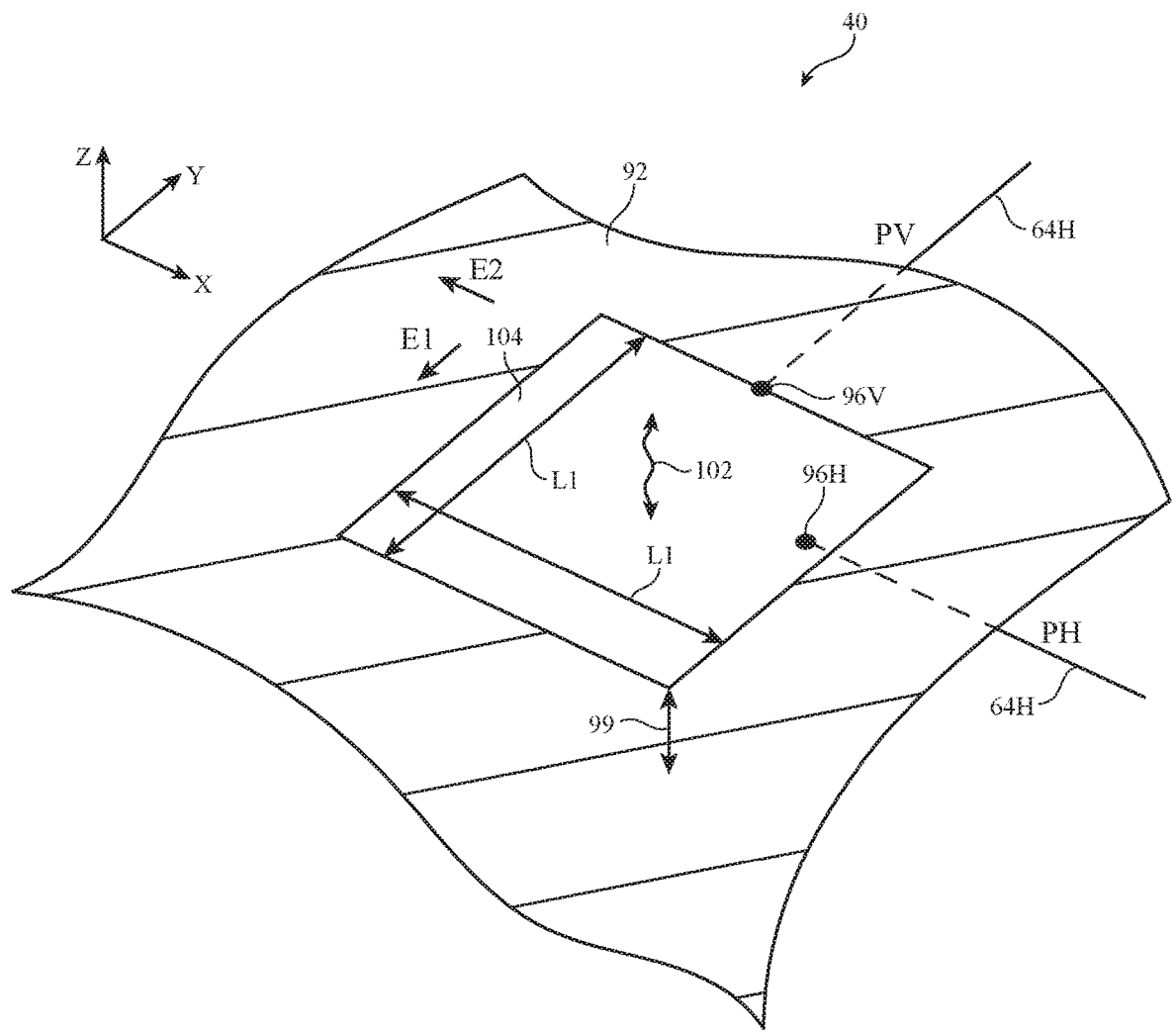
FIG. 5 is a perspective view of an illustrative antenna having multiple feeds for handling radio-frequency signals with different polarizations in accordance with an embodiment.

As shown in FIG. 5, antenna 40 may have a patch antenna resonating element 104 that is separated from and parallel to a ground plane such as antenna ground 92. Patch antenna resonating element 104 may lie within a plane such as the X-Y plane of FIG. 5 (e.g., the lateral surface area of element 104 may lie in the X-Y plane). Patch antenna resonating element 104 may sometimes be referred to herein as patch 104, patch element 104, patch resonating element 104, antenna resonating element 104, or resonating element 104. Antenna ground 92 may lie within a plane that is parallel to the plane of patch 104. Patch 104 and antenna ground 92 may therefore lie in separate parallel planes that are separated by a distance 99. Patch 104 and antenna ground 92 may be formed from conductive traces patterned on a dielectric substrate such as a rigid or flexible printed circuit board substrate, metal foil, stamped sheet metal, electronic device housing structures, or any other desired conductive structures.

The length of the sides of patch 104 may be selected so that antenna 40 resonates at a desired operating frequency. For example, the sides of patch 104 may each have a length L1 that is approximately equal to half of the wavelength of the signals conveyed by antenna 40 (e.g., the effective wavelength given the dielectric properties of the materials surrounding patch 104). In one suitable arrangement, length L1 may be between 0.8 mm and 1.2 mm (e.g., approximately 1.1 mm) for covering a millimeter wave frequency band between 57 GHz and 70 GHz, as just one example.

The example of FIG. 5 is merely illustrative. Patch 104 may have a square shape in which all of the sides of patch 104 are the same length or may have a different rectangular shape. Patch 104 may be formed in other shapes having any desired number of straight and/or curved edges. If desired, patch 104 and antenna ground 92 may have different shapes and relative orientations.

To enhance the polarizations handled by antenna 40, antenna 40 may be provided with multiple feeds. As shown in FIG. 5, antenna 40 may have a first feed at antenna port PV that is coupled to a first transmission line path 64 such as transmission line path 64V and a second feed at antenna port PH that is coupled to a second transmission line path 64 such as transmission line path 64H. The first antenna feed may have a first ground feed terminal coupled to antenna ground 92 (not shown in FIG. 5 for the sake of clarity) and a first positive feed terminal 96V coupled to patch 104. The second antenna feed may have a second ground feed terminal coupled to ground plane 92 (not shown in FIG. 5 for the sake of clarity) and a second positive feed terminal 96H coupled to patch 104.

Holes or openings such as openings may be formed in antenna ground 92 if desired. Transmission line path 64V may include a vertical conductor (e.g., a conductive through-via, conductive pin, metal pillar, solder bump, combinations of these, or other vertical conductive interconnect structures) that extends through a hole (not shown) in antenna ground 92 to positive antenna feed terminal 96V on patch 104. Transmission line path 64H may include a vertical conductor that extends through a hole (not shown) in antenna ground 92 to positive antenna feed terminal 96H on patch 104. This example is merely illustrative and, if desired, other transmission line structures may be used (e.g., coaxial cable structures, stripline transmission line structures, etc.).

When using the antenna feed associated with port PV (i.e., the antenna feed that includes positive antenna feed terminal 96V), antenna 40 may transmit and/or receive radio-frequency signals having a first polarization (e.g., the electric field E1 of antenna signals 102 associated with port PV may be oriented parallel to the Y-axis in FIG. 5). When using the antenna feed associated with port PH (i.e., the antenna feed that includes positive antenna feed terminal 96H), antenna 40 may transmit and/or receive radio-frequency signals having a second polarization (e.g., the electric field E2 of antenna signals 102 associated with port PH may be oriented parallel to the X-axis of FIG. 5 so that the polarizations associated with ports P1 and P2 are orthogonal to each other).

In scenarios such as these where the first polarization is linear and orthogonal to the second polarization (which is also linear), radio-frequency signals handled by port PV may sometimes be referred to herein as vertical polarization signals or vertically polarized signals whereas radio-frequency signals handled by port PH may sometimes be referred to herein as horizontal polarization signals or horizontally polarized signals. Transmission line path 64V may therefore sometimes be referred to herein as vertical polarization transmission line path 64V, positive antenna feed terminal 96V may sometimes be referred to herein as vertical antenna feed terminal 96V, and port PV may sometimes be referred to herein as vertical port PV. Similarly, transmission line path 64H may therefore sometimes be referred to herein as horizontal polarization transmission line path 64H, positive antenna feed terminal 96H may sometimes be referred to herein as horizontal antenna feed terminal 96H, and port PH may sometimes be referred to herein as horizontal port PH. The terms "vertical" and "horizontal" refer to the relative orientation between the signals handled by ports PH and PV (i.e., an orthogonal orientation) and do not refer to the relative orientation of the signals with respect to other components in device 10 or the surroundings of device 10.

One of ports PV and PH may be used at a given time so that antenna 40 operates as a single-polarization antenna or both ports may be operated at the same time so that antenna 40 operates with other polarizations (e.g., as a dual-polarization antenna, a circularly-polarized antenna, an elliptically-polarized antenna, etc.). If desired, the active port may be changed over time so that antenna 40 can switch between covering vertical or horizontal polarizations at a given time. Ports PV and PH may be coupled to different phase and magnitude controllers 62 (FIG. 3) or may both be coupled to the same phase and magnitude controller 62.

The example of FIG. 5 is merely illustrative and, if desired, antenna 40 may include any two antenna feeds having positive antenna feed terminals 96 coupled to patch 104 at any desired locations (e.g., regardless of polarization). If desired, antenna 40 may include one or more parasitic antenna resonating elements that serve to broaden the bandwidth of antenna 40 (e.g., where patch 104 is interposed between the parasitic antenna resonating element and antenna ground 92). Antenna 40 need not be a patch antenna and may be implemented as any other type of antenna if desired (e.g., an antenna having two feeds for covering two polarizations).

Figure 6:
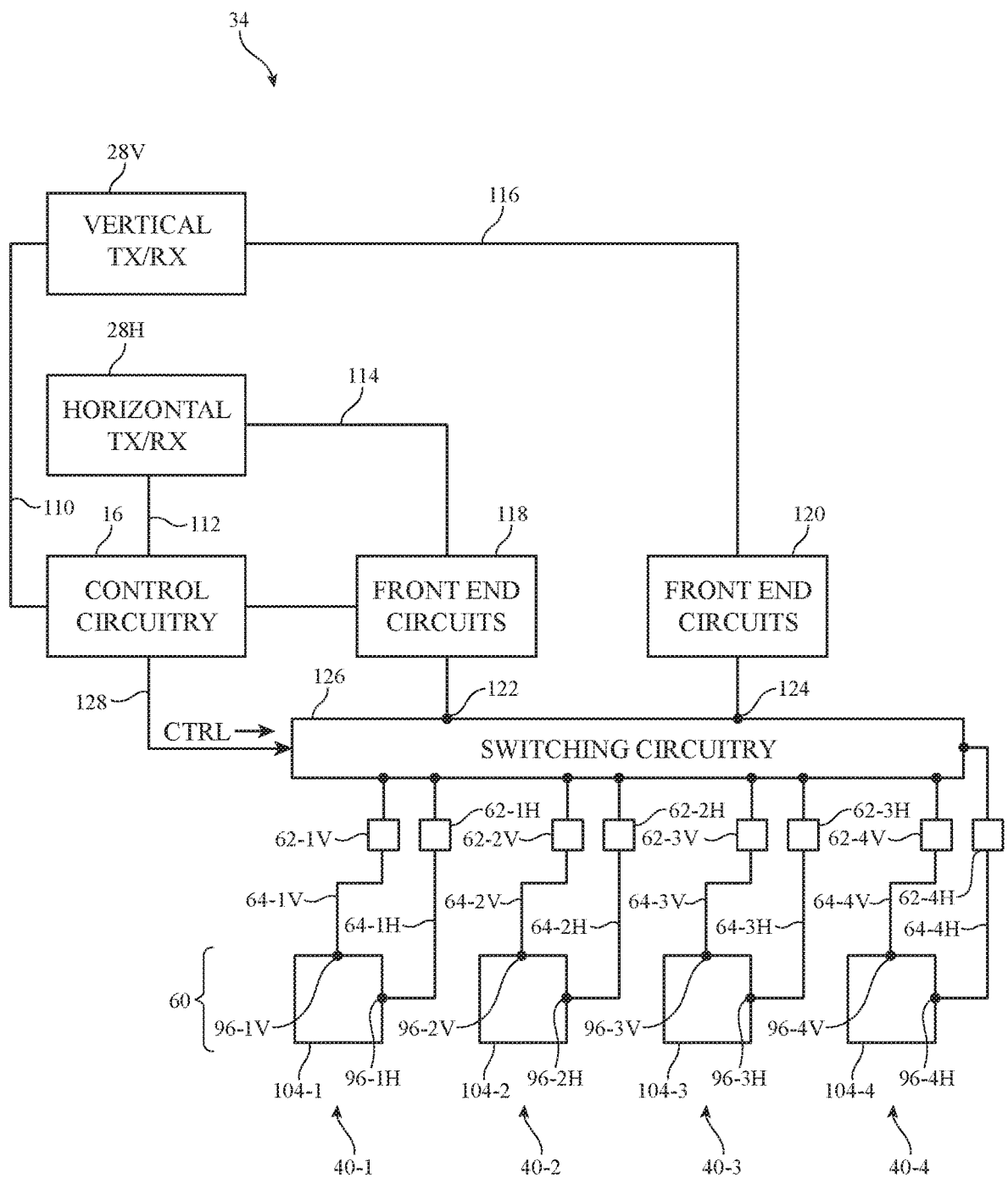
FIG. 6 is a circuit diagram of illustrative wireless communications circuitry having a phased antenna array with proximity detection capabilities in accordance with an embodiment.

If desired, each antenna 40 in phased antenna array 60 (FIG. 3) may be provided with two feeds as shown in FIG. 5. The phased antenna array 60 may be controlled by control circuitry 16 (FIG. 2) to perform external object proximity detection operations to detect the proximity (e.g., presence) of external object 56 (FIG. 3) adjacent to phased antenna array 60. FIG. 6 is a circuit diagram showing how wireless communications circuitry 34 may be coupled to phased antenna array 60 for performing external object proximity detection.

As shown in FIG. 6, wireless communications circuitry 34 may include a first millimeter wave transceiver 28 such as vertical transceiver (TX/RX) 28V and a second millimeter wave transceiver 28 such as horizontal transceiver 28H. Transceiver 28V may be coupled to control circuitry 16 over data path 110. Transceiver 28H may be coupled to control circuitry 16 over data path 112. Control circuitry 16 may include applications processor circuitry for running operating system software or other software associated with the control and operation of device 10. Baseband processor circuitry may be formed within control circuitry 16, as a part of transceivers 28V and 28H, or between control circuitry 16 and transceivers 28V and 28H.

If desired, control circuitry 16, vertical transceiver 28V, and horizontal transceiver 28H may each be formed on separate substrates such as separate integrated circuits, integrated circuit packages, chips, or printed circuit boards. In another suitable arrangement, two or more of control circuitry 26, vertical transceiver 28V, and horizontal transceiver 28H may be formed on the same substrate such as a shared integrated circuit, integrated circuit package, chip, or printed circuit board.

Vertical transceiver 28V and horizontal transceiver 28H may each include digital-to-analog converter circuitry, analog-to-digital converter circuitry, power amplifier circuitry, low noise amplifier circuitry, mixer circuitry (e.g., up-converter and down-converter circuitry), or other circuitry for generating and receiving radio-frequency signals at frequencies between 10 GHz and 300 GHz. If desired, additional mixing circuitry may be formed on data paths 110 and 112 for converting baseband data generated by baseband processor circuitry in control circuitry 16 to an intermediate frequency greater than a baseband frequency and less than 10 GHz. Conveying signals across device 10 at intermediate frequencies may, for example, involve less path loss than conveying signals across device 10 at frequencies greater than 10 GHz.

Phased antenna array 60 may include multiple antennas 40 each having multiple antenna feeds for covering different polarizations (e.g., vertical antenna feeds having vertical antenna feed terminals 96V and horizontal antenna feeds having horizontal antenna feed terminals 96H as shown in FIG. 5). In the example of FIG. 6, phased antenna array 60 includes four antennas 40-1, 40-2, 40-3, and 40-4. Antenna 40-1 may include a vertical antenna feed having a vertical antenna feed terminal 96-1V and a horizontal antenna feed having a horizontal antenna feed terminal 96-1H. Antenna 40-2 may include a vertical antenna feed having a vertical antenna feed terminal 96-2V and a horizontal antenna feed having a horizontal antenna feed terminal 96-2H. Antenna 40-3 may include a vertical antenna feed having a vertical antenna feed terminal 96-3V and a horizontal antenna feed having a horizontal antenna feed terminal 96-3H. Antenna 40-4 may include a vertical antenna feed having a vertical antenna teed terminal 96-4V and a horizontal antenna feed having a horizontal antenna feed terminal 96-4H. This example is merely illustrative and, in general, phased antenna array 60 may include any desired number of antennas arranged in any desired pattern. The antennas in phased antenna array 60 of FIG. 6 may include any desired number of antenna feeds at any desired number of locations for covering radio-frequency signals with one or more different polarizations. Vertical transceiver 28V may handle radio-frequency signals conveyed by vertical antenna feed terminals 96-1V, 96-2V, 96-3V, and 96-4V of phased antenna array 60. Horizontal transceiver 28H may handle radio-frequency signals conveyed by horizontal antenna feed terminals 96-1H, 96-2H, 96-3H, and 96-4H of phased antenna array 60.

The antenna feeds in phased antenna array 60 may be coupled to switching circuitry 126 over respective transmission line paths (e.g., transmission line paths 64H and 64V as shown in FIG. 5). As shown in FIG. 6, transmission line path 64-1V may be coupled between switching circuitry 126 and vertical antenna feed terminal 96-1V of antenna 40-1, transmission line path 64-1H may be coupled between switching circuitry 126 and horizontal antenna feed terminal 96-1H of antenna 40-1, transmission line path 64-2V may be coupled between switching circuitry 126 and vertical antenna feed terminal 96-2V of antenna 40-2, transmission line path 64-1H may be coupled between switching circuitry 126 and horizontal antenna feed terminal 96-2H of antenna 40-2, transmission line path 64-3V may be coupled between switching circuitry 126 and vertical antenna feed terminal 96-3V of antenna 40-3, etc.

Respective phase and magnitude controllers (e.g., phase and magnitude controllers 62 as shown in FIG. 3) may be interposed on each transmission line path 64. As shown in FIG. 6, phase and magnitude controller 62-1V may be interposed on transmission line path 64-1V, phase and magnitude controller 62-1H may be interposed on transmission line path 64-1H, phase and magnitude controller 62-2V may be interposed on transmission line path 64-2V, phase and magnitude controller 62-2H may be interposed on transmission line path 64-2H, phase and magnitude controller 62-3V may be interposed on transmission line path 64-3V, etc. Each of the phase and magnitude controllers may be controlled by control signals received from control circuitry 16. This example is merely illustrative. If desired, the same phase and magnitude controller may be interposed on two or more transmission line paths. In general, any desired transmission line structures may be used.

Switching circuitry 126 may include any desired switch network of any desired number of switches arranged in any desired manner. In one suitable example, switching circuitry 126 may be a switch matrix having a first port 122 and a second port 124. As shown in FIG. 6, first port 122 of switching circuitry 126 may be coupled to horizontal transceiver 28H over path 114. Second port 124 of switching circuitry 126 may be coupled to vertical transceiver 28V over path 116.

Control circuitry 16 may control the state of switching circuitry 126 using control signals CTRL provided over control path 128. Control signals CTRL may control switching circuitry 126 to selectively activate a desired set of antenna feeds in phased antenna array 60 at any given time. For example, control signals CTRL may control switching circuitry 126 to activate a selected number of vertical antenna feed terminals 96-1V, 96-2V, 96-3V, and 96-4V (e.g., by coupling those antenna feed terminals to port 124 and vertical transceiver 28V) and to activate a selected number of horizontal positive antenna feed terminals 96-1H, 96-2H, 96-3H, and 96-4H (e.g., by coupling those antenna feed terminals to port 122 and horizontal transceiver 28H) at any given time. Similarly, control signals CTRL may deactivate a selected number of vertical antenna feed terminals 96-1V, 96-2V, 96-3V, and 96-4V (e.g., by decoupling those antenna feed terminals from port 124) and a selected number of horizontal positive antenna feed terminals 96-1H, 96-2H, 96-3H, and 96-4H (e.g., by decoupling those antenna feed terminals from port 122) at any given time.

Front end circuitry such as front end circuits 118 may be interposed on path 114 between horizontal transceiver 28H and port 122. Front end circuitry such as front end circuits 120 may be interposed on path 116 between vertical transceiver 28V and port 124. Front end circuits 118 and 120 may each include impedance matching circuitry, switching circuitry, filter circuitry, or any other desired radio-frequency front end components (e.g., networks of passive and/or active (adjustable) components such as resistors, inductors, and capacitors, etc.). If desired, front end circuits 118 and 120 may each include passive filtering circuitry such as duplexer circuitry, diplexer circuitry, low pass filter circuitry, high pass filter circuitry, bandpass filter circuitry, notch filter circuitry, impedance matching circuitry, etc. The filter circuitry in front end circuits 118 may, for example, isolate transmit and receive signals that are conveyed over respective transmit and receive ports on horizontal transceiver 28H. Similarly, the filter circuitry in front end circuits 120 may isolate transmit and receive signals that are conveyed over respective transmit and receive ports on horizontal transceiver 28V. If desired, filter circuitry for isolating transmit and receive signals may be formed elsewhere in wireless communications circuitry 34 such as between switching circuitry 126 and phase and magnitude controllers 62, between phase and magnitude controllers 62 and antennas 40, as a part of switching circuitry 126, etc. In another suitable arrangement, path 114 may include multiple conductive lines for coupling one or more transmit ports and one or more receive ports of horizontal transceiver 28H to switching circuitry 126. Similarly, path 116 may include multiple conductive lines for coupling one or more transmit ports and one or more receive ports of vertical transceiver 28V to switching circuitry 126 (e.g., filtering circuitry for isolating horizontal and receive ports may be omitted if desired).

In this way, control circuitry 16 may selectively activate different antenna feed terminals in phased antenna array 60 for either transmitting or receiving radio-frequency signals at any given time. For example, control circuitry 16 may provide control signals CTRL to switching circuitry 126 to selectively activate a desired number of vertical antenna feed terminals 96-1V, 96-2V, 96-3V, and 96-4V for transmitting radio-frequency signals (e.g., by coupling those vertical antenna feed terminals to one or more transmit ports of vertical transceiver 28V). Similarly, control signals CTRL may control switching circuitry 126 to selectively activate a desired number of vertical antenna feed terminals 96-1V, 96-2V, 96-3V, and 96-4V for receiving radio-frequency signals (e.g., by coupling those vertical antenna feed terminals to one or more receive ports of vertical transceiver 28V). One or more vertical antenna feed terminals 96-1V, 96-2V, 96-3V, and 96-4V may be decoupled from vertical transceiver 28V so that those vertical antenna feed terminals do not transmit or receive any radio-frequency signals if desired.

Control signals CTRL may also control switching circuitry 126 to selectively activate a desired number of horizontal antenna feed terminals 96-1H, 96-2H, 96-3H, and 96-4H for transmitting radio-frequency signals (e.g., by coupling those horizontal antenna feed terminals to one or more transmit ports of horizontal transceiver 28H). Similarly, control signals CTRL may control switching circuitry 126 to selectively activate a desired number of horizontal antenna feed terminals 96-1H, 96-2H, 96-3H, and 96-4H for receiving radio-frequency signals (e.g., by coupling those horizontal antenna feed terminals to one or more receive ports of horizontal transceiver 28H). One or more horizontal antenna feed terminals 96-1H, 96-2H, 96-3H, and 96-4H may be decoupled from horizontal transceiver 28H so that the horizontal antenna feed terminals do not transmit or receive any radio-frequency signals if desired.

Phase and magnitude controllers 62 (e.g., phase and magnitude controllers 62-1V, 62-1H, 62-2V, 62-2H, etc.) may be adjusted to steer the beam of radio-frequency signals handled by phased antenna array 60 (e.g., as shown in FIG. 3). If desired, phase and magnitude controllers 62 may each include phase measurement circuitry that measures the phase of radio-frequency signals received over phased antenna array 60. For example, phase and magnitude controller 62-1V may measure the phase of radio-frequency signals received over antenna feed terminal 96-1V (e.g., vertically polarized radio-frequency signals received by antenna 40-1), phase and magnitude controller 62-1H may measure the phase of radio-frequency signals received over antenna feed terminal 96-1H (e.g., horizontally polarized radio-frequency signals received by antenna 40-1), phase and magnitude controller 62-2V may measure the phase of radio-frequency signals received over antenna feed terminal 96-2V (e.g., vertically polarized radio-frequency signals received by antenna 40-2), etc. Phase and magnitude controllers 62 may pass the phase measurements to control circuitry 16. Control circuitry 16 may store and process the phase measurements over time. If desired, phase measurement circuitry for measuring the phase of received radio-frequency signals may be located elsewhere in wireless communications circuitry 34 (e.g., on transmission line paths 64 separate from phase and magnitude controllers 62, coupled to transmission line paths 64 via radio-frequency coupler circuitry, in switching circuitry 126, on paths 114 and 116, in transceivers 28V and 28H, etc.).

Antenna feed terminals in phased antenna array 60 that have been activated for transmitting radio-frequency signals (e.g., that have been coupled to corresponding transmit ports on transceivers 28V and 28H by switching circuitry 126) may sometimes be referred to herein as transmit antenna feed terminals. Antenna feed terminals in phased antenna array 60 that have been activated for receiving radio-frequency signals (e.g., that have been coupled to corresponding receive ports on transceivers 28V and 28H by switching circuitry 126) may sometimes be referred to herein as receive antenna feed terminals.

Control circuitry 16 may control phased antenna array 60 to transmit and receive radio-frequency signals over different combinations (permutations) of antenna feed terminals 96-1V, 96-2V, 96-3V, 96-4V, 96-1H, 96-2H, 96-3H, and 96-4H over time. Control circuitry 16 may store phase measurements performed by wireless communications circuitry 34 (e.g., generated by phase and magnitude controllers 62) for each of these combinations of transmit and receive antenna feed terminals over time. The presence of external objects such as external object 56 of FIG. 3 adjacent to phased antenna array 60 may affect (alter) the phase measurements obtained by wireless communications circuitry 34 relative to a free space scenario in which no external objects are adjacent to phased antenna array 60. Control circuitry 16 may process the gathered phase measurements to detect the proximity of external objects relative to phased antenna array 60 (e.g., by comparing the phase measurements for the different combinations of transmit and receive antenna feed terminals to corresponding phase measurements gathered in a free space scenario).

Figure 7:
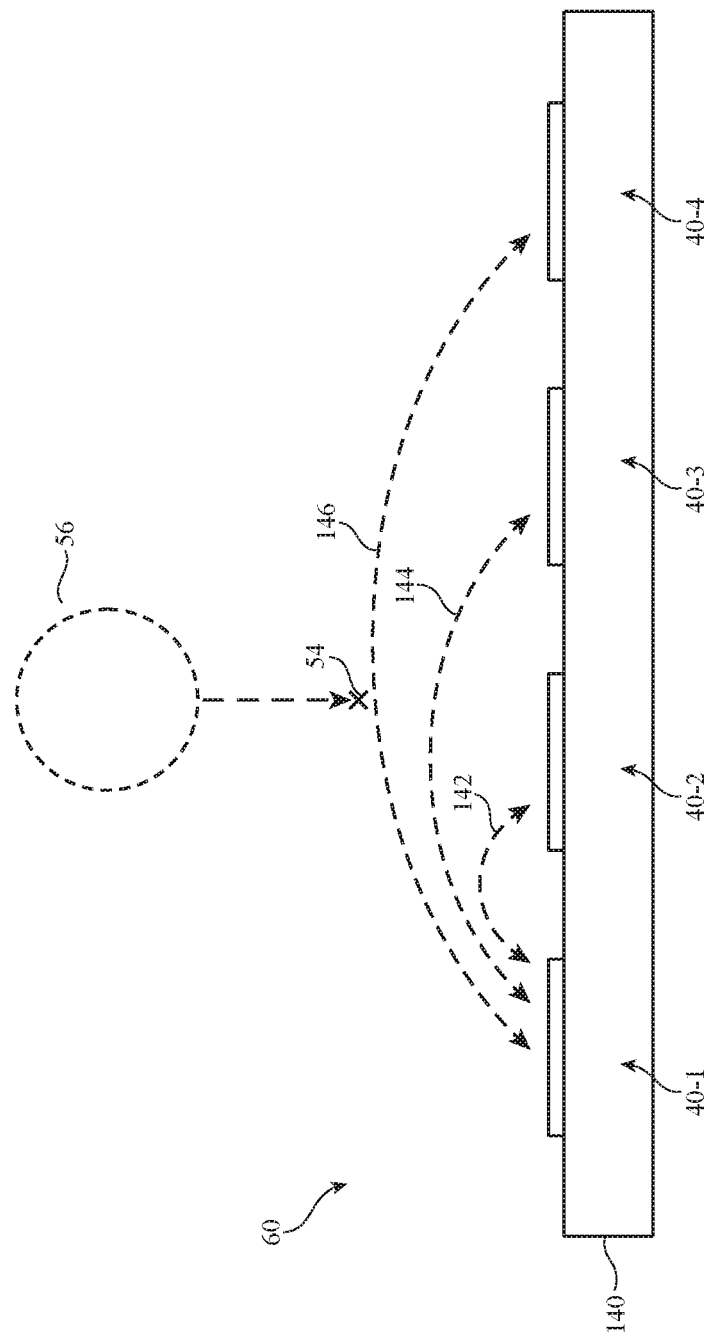
FIG. 7 is a side view of an illustrative phased antenna array showing how electromagnetic coupling between antennas in the phased antenna array may be influenced by the presence of an external object in accordance with an embodiment.

FIG. 7 is a side view of phased antenna array 60 showing how the presence of external objects adjacent to phased antenna array 60 may affect the phases of received radio-frequency signals measured by wireless communications circuitry 34. As shown in FIG. 7, antennas 40-1, 40-2, 40-3, and 40-4 may be formed on a dielectric substrate such as substrate 140. Substrate 140 may be, for example, a rigid or printed circuit board or other dielectric substrate. Substrate 140 may include multiple stacked dielectric layers (e.g., multiple layers of printed circuit board substrate such as multiple layers of fiberglass-filled epoxy, multiple layers of ceramic substrate, etc.). Antennas 40-1, 40-2, 40-3, and 40-4 may be embedded within and/or mounted to a surface of substrate 140. For example, antenna ground 92 and patch 104 (FIG. 5) of antennas 40-1, 40-2, 40-3, and 40-4 may be formed on different layers of substrate 140 and may be embedded within or formed at an exterior surface of substrate 140 if desired.

When a given antenna in phased antenna array 60 transmits radio-frequency signals, a portion of the transmitted radio-frequency signals may be received over the air at the other antennas in phased antenna array 60. In a free space environment (e.g., in the absence of external object 56), the phase of the transmitted radio-frequency signal is offset from the phases of the received radio-frequency signals due to the non-zero distances between the antenna that transmitted the radio-frequency signals and the antennas that received the radio-frequency signals.

Consider an example in which antenna 40-1 transmits radio-frequency signals at a known phase φ. Some of the transmitted radio-frequency signals are received at antenna 40-2, antenna 40-3, and antenna 40-4. Phase measurement circuitry coupled to antennas 40-2, 40-3, and 40-4 may measure the phases of the transmitted radio-frequency signals as received at antennas 40-2, 40-3, and 40-4. The phases of the received signals may be different from phase φ because of the non-zero distance between antenna 40-1 and antennas 40-2, 40-3, and 40-4. Control circuitry 16 (FIG. 6) may already have knowledge of phase φ (e.g., because control circuitry 16 controls the phase and magnitude controller coupled to antenna 40-1 when transmitting the radio-frequency signals at phase φ). Control circuitry 16 may compare known phase φ to the phases of the received signals measured for antennas 40-2, 40-3, and 40-4 to generate respective phase difference values Δφ between the transmitted radio-frequency signals and radio-frequency signals received by each of antennas 40-2, 40-3, and 40-4. The antennas 40 in phased antenna that transmit radio-frequency signals for detecting the proximity of external object 56 may sometimes be referred to herein as transmit antennas whereas the antenna 40 that receive the transmitted radio-frequency signals for detecting the proximity of external object 56 may sometimes be referred to herein as receive antennas.

In a free space environment, phase difference values Δφ will have a predetermined magnitude based primarily on the spatial distance between the transmit and receive antennas. Control circuitry 16 may store predetermined phase difference values between each combination of transmit and receive antennas. The predetermined phase difference values (sometimes referred to herein as free space phase difference values) may be generated for device 10 during calibration of wireless communications circuitry 34 in a free space environment (e.g., during device manufacture and testing and before normal use by an end user of device 10). In general, the phase difference values may vary based on which particular combination of antenna feed terminals are used (e.g., antenna feed terminals 96-1V, 96-2V, 96-3V, 96-4V, 96-1H, 96-2H, 96-3H, and 96-4H of FIG. 6). If desired, control circuitry 16 may store predetermined (calibrated) phase difference values for each possible combination (or a subset of each possible combination) of transmit and receive antenna feed terminals in phased antenna array 60.

In free space, antennas 40 in phased antenna array 60 may exhibit electromagnetic mutual couplings. For example, antennas 40-1 and 40-4 may exhibit a mutual coupling 146, antennas 40-1 and 40-3 may exhibit a mutual coupling 144, and antennas 40-1 and 40-2 may exhibit a mutual coupling 142. In general, antennas that are closer together may exhibit stronger mutual coupling than antennas that are farther apart (e.g., mutual coupling 142 may be stronger than mutual coupling 144 which is stronger than mutual coupling 146). In general, each possible pair of antennas 40 in phased antenna array 60 exhibits a corresponding mutual coupling.

In the presence of external objects such as external object 56, external object 56 may alter the electromagnetic mutual coupling between two or more antennas 40 in phased antenna array 60. As external object 56 moves closer to device 10, external object 56 may exhibit greater influence on the mutual coupling between antennas 40 in phased antenna array 60. In general, the phase of the radio-frequency signals received by antennas 40-2, 40-3, and 40-4 may be dependent upon the strength of mutual couplings 142, 144, and 146, respectively. As mutual couplings 142, 144, and/or 146 are altered (e.g., as external object 56 approaches phased antenna array 60), the phases of the received radio-frequency signals measured for antennas 40-2, 40-3, and/or 40-4 may change so that the phase differences between the received radio-frequency signals and the transmitted radio-frequency signals is different or greater than the phase differences in free space).

Control circuitry 16 may monitor the phase differences between the received radio-frequency signals and the transmitted radio-frequency signals to detect changes in phase difference that are indicative of changes in mutual couplings 142, 144, and/or 146 and that are thus indicative of the proximity of external object 56 to phased antenna array 60 (e.g., the presence of external object 56 within a predetermined distance such as at location 54 adjacent to phased antenna array 60). For example, control circuitry 16 may compare current phase difference values measured by phased antenna array 60 to predetermined free space phase difference values that would be expected for phased antenna array 60 in the absence of external object 56. If the difference between the current phase difference values and the free space phase difference values is excessive, control circuitry 16 may identify that external object 56 is adjacent to (e.g., within a predetermined distance of) phased antenna array 60. In general, greater differences between the current phase difference values and the free space phase difference values may be indicative of closer external object proximities than lesser differences between the current phase difference values and the free space phase difference values.

The example of FIG. 7 is merely illustrative. In general, external object 56 may alter mutual couplings between respective pairs of vertical and horizontal antenna feed terminals in phased antenna array 60. Control circuitry 16 may control phased antenna array 60 to transmit the radio-frequency signals using one, two, or more than two antenna feeds on any desired antennas in phased antenna array 60. Control circuitry 16 may control phased antenna array 60 to receive the transmitted radio-frequency signals and to measure phases of the received radio-frequency signals over one, two, or more than two antenna feeds on any desired antennas in phased antenna array 60. Control circuitry 16 may cycle through different combinations vertical and/or horizontal antenna feeds for transmitting and receiving radio-frequency signals over time. Control circuitry 16 may monitor phase difference values between the antenna feeds for each of these combinations and may process the phase difference values to identify the proximity of external object 56 (e.g., by comparing the phase difference values to predetermined free space phase difference values). In this way, control circuitry 16 may use phased antenna array 60 itself to detect the proximity of external objects in real time.

Figure 8:
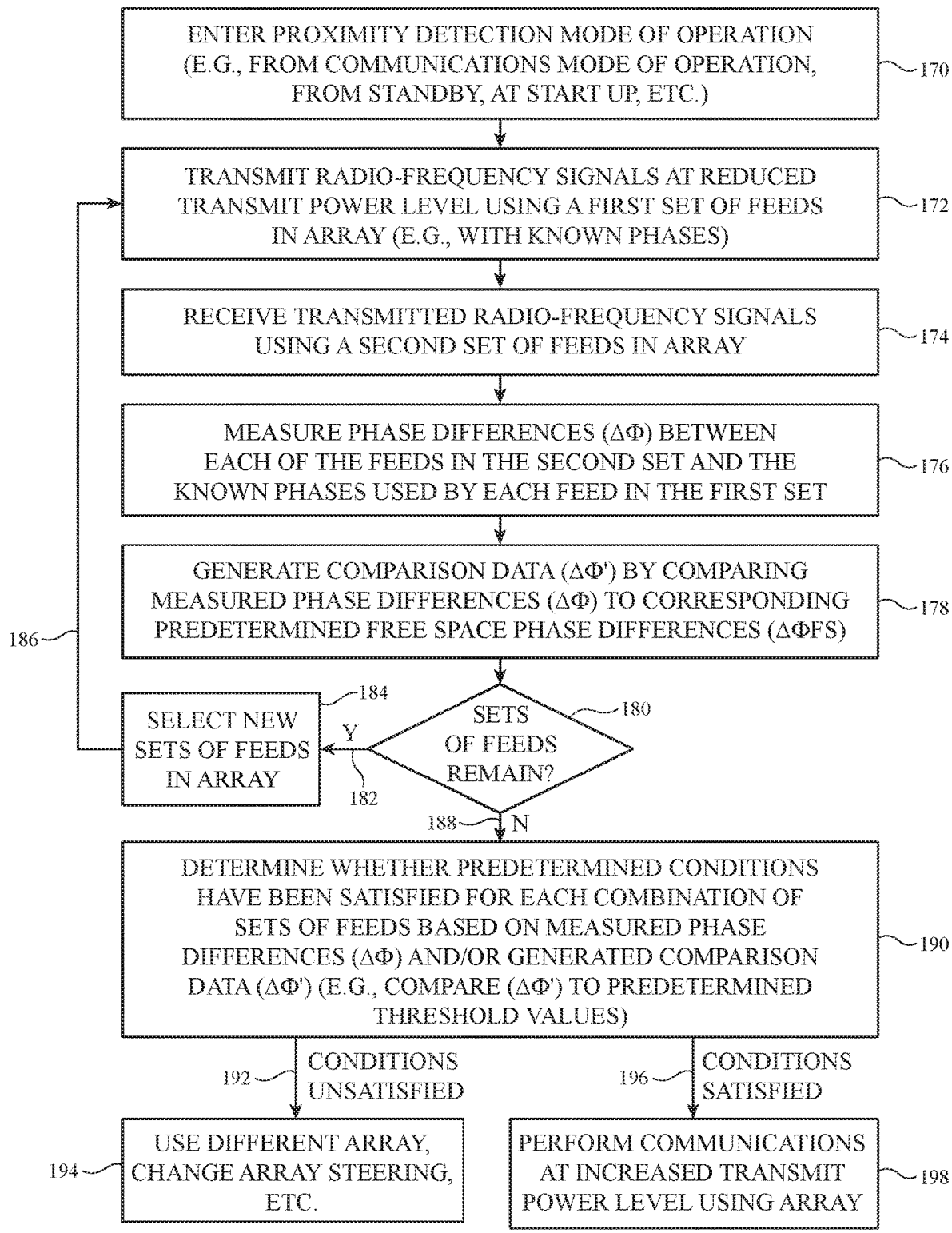
FIG. 8 is a flow chart of illustrative steps that may be performed by an electronic device of the type shown in FIGS. 1-7 for detecting the proximity of external objects using a phased antenna array in accordance with an embodiment.

FIG. 8 is a flow chart of illustrative steps that may be performed by electronic device 10 for performing external object proximity detection using phased antenna array 60. At step 170, device 10 may enter a proximity detection mode of operation. Device 10 may perform external object proximity detection while in the proximity detection mode of operation to determine whether an external object such as external object 56 (FIGS. 3 and 7) is adjacent to within a predetermined distance of) device 10. Device 10 may enter the proximity detection mode of operation upon device start up, from a standby mode of operation in which the device is powered on but not being actively used by a user, or from a communications mode of operation, as examples.

In the communications mode of operation, wireless communications circuitry 34 may transmit and receive radio-frequency signals using phased antenna array 60 (FIG. 6). The radio-frequency signals may include communications data conveyed between device 10 and external wireless equipment. Wireless communications circuitry 34 may transmit the radio-frequency signals at a frequency between 10 GHz and 300 GHz. Wireless communications circuitry 34 may transmit the radio-frequency signals at an increased power level (e.g., a maximum power level of wireless communications circuitry 34). Transmitting the radio-frequency signals at the increased power level may ensure that a satisfactory wireless link quality is maintained between device 10 and the external wireless equipment. However, an external object adjacent to phased antenna array 60 may be subject to excessive radio-frequency power density, particularly at the increased power level associated with the communications mode of operation.

In the proximity detection mode of operation, wireless communications circuitry 34 may continue to transmit radio-frequency signals that convey communications data for external wireless equipment or may transmit radio-frequency signals that do not convey any communications data for external wireless equipment (e.g., radio-frequency test signals). Wireless communications circuitry 34 may transmit the radio-frequency signals at a reduced power level in the proximity detection mode of operation (e.g., a power level that is less than the increased power level used during the communications mode of operation). As examples, the reduced power level may be 5 dB less than the increased power level used during the communications mode of operation, may be between 5 dB and 10 dB less than the increased power level, may be between 10 dB and 15 dB less than the increased power level, may be between 5 dB and 20 dB less than the increased power level, may be more than 20 dB less than the increased power level, may be between 3 dB and 5 dB less than the increased power level, may be 13 dB less than the power level, etc. The reduced power level may help to minimize wireless power density and thus any possible absorption by external objects that could be adjacent to phased antenna array 60 during the proximity detection mode of operation.

Device 10 may enter the proximity detection mode of operation from the communication mode of operation periodically or in response to a software trigger (e.g., a trigger in an application or software running on control circuitry 16, a software trigger generated in response to a user input to device 10, a software trigger issued at a predetermined time, a software trigger generated in response to sensor circuitry from sensor circuitry on device 10 such as sensor data that identifies that an external object may be adjacent to phased antenna array 60, a software trigger received from external wireless equipment, etc.). Device 10 may detect the proximity (e.g., presence or absence) of external objects such as external object 56 (FIGS. 3 and 7) while in the proximity detection mode of operation.

At step 172, wireless communications circuitry 34 may transmit radio-frequency signals at the reduced power level using a first set of antenna feeds (a first set of antenna feed terminals) in phased antenna array 60. In the example of FIG. 6, control circuitry 16 may control switching circuitry 126 so that a first set of antenna feed terminals 96-1V, 96-2V, 96-3V, 96-4V, 96-1H, 96-2H, 96-3H, and 96-4H is coupled to corresponding transmit ports on transceivers 28H and/or 28V. The first set of antenna feed terminals may include one vertical antenna feed terminal such as vertical antenna feed terminal 96-1V, one horizontal antenna feed terminal such as horizontal antenna feed terminal 96-3H, multiple vertical antenna feed terminals such as vertical antenna feed terminals 96-1V and 96-2V, multiple horizontal antenna feed terminals such as horizontal antenna feed terminals 96-4H and 96-1H, or a combination of horizontal and vertical antenna feed terminals such as antenna feed terminals 96-1V and 96-1H (as examples). In general, the first set of antenna feed terminals may include any desired combination of one or more of antenna feeds 96-1V, 96-2V, 96-3V, 96-4V, 96-1H, 96-2H, 96-3H, and 96-4H.

Control circuitry 16 may control phase and magnitude controllers 62 so that the first set of antenna feed terminals transmits the radio-frequency signals using known phases. In a scenario where the first set of antenna feed terminals includes only antenna feed terminal 96-1V, control circuitry 16 may control phase and magnitude controllers 62 so that antenna feed terminal 96-1V transmits the radio-frequency signals with a selected (known) phase $\varphi$, as an example.

As shown in FIG. 8, at step 174, wireless communications circuitry 34 may receive the radio-frequency signals transmitted by the first set of antenna feed terminals using a second set of antenna feeds (a second set of antenna feed terminals) in phased antenna array 60. The second set of antenna feed terminals may include antenna feed terminals in phased antenna array 60 that are not included in the first set of antenna feed terminals (e.g., the first and second sets may be mutually exclusive). In the example of FIG. 6, control circuitry 16 may control switching circuitry 126 so that a second set of antenna feed terminals 96-1V, 96-2V, 96-3V, 96-4V, 96-1H, 96-2H, 96-3H, and 96-4H is coupled to corresponding receive ports on transceivers 28H and/or 28V. The first set of antenna feed terminals may include one vertical antenna feed terminal such as vertical antenna feed terminal 96-1V, one horizontal antenna feed terminal such as horizontal antenna feed terminal 96-2H, multiple vertical antenna feed terminals such as vertical antenna feed terminals 96-3V and 96-2V, multiple horizontal antenna feed terminals such as horizontal antenna feed terminals 96-2H and 96-3H, or a combination of horizontal and vertical antenna feed terminals such as antenna feed terminals 96-2V and 96-1H (as examples). In one particular example, the second set of antenna feed terminals may include all of the remaining antenna feed terminals in phased antenna array 60 that were not included in the first set of antenna feed terminals (e.g., the second set of antenna feed terminals may include antenna feed terminals 96-2V, 96-3V, 96-4V, 96-1H, 96-2H, 96-3H, and 96-4H in the scenario where the first set of antenna feed terminals includes only antenna feed terminal 96-1V). In general, the first set of antenna feed terminals may include any desired combination of one or more of antenna feeds 96-1V, 96-2V, 96-3V, 96-4V, 96-1H, 96-2H, 96-3H, and 96-4H.

Returning to FIG. 8, at step 176, phase measurement circuitry in wireless communications circuitry 34 (e.g., phase measurement circuitry in phase and magnitude controllers 62 of FIGS. 3 and 6) may measure the phases (e.g., may gather phase measurement values) of the radio-frequency signals received by the second set of antenna feed terminals. The phase measurement circuitry may pass the phase measurement values to control circuitry 16 for further processing. In the scenario where the first set of antenna feed terminals includes only antenna feed terminal 96-1V and the second set includes all of the remaining antenna feed terminals of FIG. 6, control circuitry 16 may identify phase measurement values for the radio-frequency signals received by antenna feed terminals 96-2V, 96-3V, 96-4V, 96-1H, 96-2H, 96-3H, and 96-4H.

Control circuitry 16 may generate phase difference values $\Delta\varphi$ between each of the antenna feed terminals in the second set and each of the antenna feed terminals in the first set (e.g., by computing differences between the known phases of the transmitted signals and the phases measured for the received signals). For example, in the scenario where the first set of antenna feed terminals includes only antenna feed terminal 96-1V and the second set includes all of the remaining antenna feed terminals of FIG. 6, control circuitry 16 may generate seven phase difference values $\Delta\varphi$, where each phase difference value is calculated by subtracting the known phase φ of the transmitted radio-frequency signals from the phase measurement values gathered from the radio-frequency signals received by antenna feed terminals 96-2V, 96-3V, 96-4V, 96-1H, 96-2H, 96-3H, and 96-4H, respectively (e.g., a first phase difference value equal to the difference between the phase measurement value for antenna feed terminal 96-2V and phase φ, a second phase difference value equal to the difference between the phase measurement value for antenna feed terminal 96-3V and phase φ, a third phase difference value equal to the difference between the phase measurement value for antenna feed terminal 96-4V and phase φ, etc.).

As another example, in a scenario where the first set of antenna feed terminals includes only antenna feed terminals 96-1H and 96-1V and the second set of antenna feeds includes only antenna feeds 96-4H and 96-4V, control circuitry 16 may generate four phase difference values Δφ (e.g., a first phase difference value equal to the difference between the known phase of the radio-frequency signals transmitted by antenna feed terminal 96-1H and the phase measurement value gathered for antenna feed terminal 96-4H, a second phase difference value equal to the difference between known phase of the radio-frequency signals transmitted by antenna feed terminal 96-1H and the phase measurement value gathered for antenna feed terminal 96-4V, a third phase difference value equal to the difference between the known phase of the radio-frequency signals transmitted by antenna feed terminal 96-1V and the phase measurement value gathered for antenna feed terminal 96-4H, and a fourth phase difference value equal to the difference between the known phase of the radio-frequency signals transmitted by antenna feed terminal 96-1V and the phase measurement value gathered for antenna feed terminal 96-4V). The generated phase difference values Δφ may be stored at control circuitry 16 for further processing.

At step 178, control circuitry 16 may generate comparison data values Δφ' by comparing the generated phase difference values Δφ to predetermined (e.g., calibrated) phase difference values stored at control circuitry 16. The predetermined phase difference values stored at control circuitry 16 may sometimes be referred to herein as free space phase difference values ΔφFS. Free space phase difference values ΔφFS may, for example, be generated and stored at control circuitry 16 during calibration of wireless communications circuitry 34 or device 10 in a controlled free space environment in which no external objects such as external object 56 of FIG. 7 are present. Control circuitry 16 may generate comparison data values Δφ (sometimes referred to herein collectively as comparison data) by subtracting phase difference values Δφ from the free space phase difference value ΔφFS generated for the same corresponding pair of antenna feed terminals. Control circuitry 16 may, for example, generate a respective free space phase difference value ΔφFS for each phase difference value Δφ generated at step 176.

For example, in the scenario where the first set of antenna feed terminals includes only antenna feed terminal 96-1V and the second set of antenna feed terminals includes antenna feed terminals 96-2V, 96-3V, 96-4V, 96-1H, 96-2H, 96-3H, and 96-4H of FIG. 6, control circuitry 16 may generate seven comparison data values. The comparison data values may include a first comparison data value generated by subtracting the first phase difference value between antenna feed terminals 96-1V and 96-2V from a first free space phase difference value generated using the same antenna feed terminals 96-1V and 96-2V during device calibration, a second comparison data value generated by subtracting the second phase difference value generated between antenna feed terminals 96-1V and 96-3V from a second free space phase difference value generated using the same antenna feed terminals 96-1V and 96-3V during device calibration, etc.

In general, non-zero comparison data values may be indicative of a change in phase of the received radio-frequency signals relative to the transmitted radio-frequency signals, which may in turn be indicative in an alteration in mutual coupling between the antennas in phased antenna array 60 caused by the proximity of an external object (e.g., external object 56 of FIG. 7). In general, greater comparison data values may be indicative of a larger and/or closer external object than lower comparison data values. Similarly, a greater number of non-zero comparison data values may be indicative of a larger and/or closer external object than a smaller number comparison data values.

At step 180, control circuitry 16 may determine whether any sets of antenna feed terminals in phased antenna array 60 remain for characterization (e.g., whether any combinations of first and second sets of antenna feed terminals in phased antenna array 60 remain for characterization). If sets of antenna feed terminals remain for characterization, processing may proceed to step 184 as shown by path 182.

At step 184, control circuitry 16 may select new first and/or second sets of antenna feed terminals for characterization (e.g., new combinations of transmit and/or receive antenna feed terminals). Processing may subsequently loop back to step 172 as shown by path 186 to generate comparison data Δφ for phased antenna array 60 using the selected new first and/or second sets of antenna feeds.

For example, in the scenario where the first set of antenna feed terminals includes only antenna feed terminal 96-1V and the second set of antenna feed terminals includes the remaining antenna feed terminals of FIG. 6, the new first set of antenna feed terminals may include only antenna feed terminal 96-2V and the second set of antenna feed terminals may include the remaining antenna feed terminals in phased antenna array 60. In this way, control circuitry 16 may cycle through different transmit antenna feed terminals during each iteration of steps 172-184. As other examples, the first set of antenna feed terminals (as selected at step 184 or during the first iteration of step 172) may include each of the vertical antenna feed terminals whereas the second set of antenna feed terminals (as selected at step 184 or during the first iteration of step 174) may include each of the horizontal antenna feed terminals, the first set may include each of the horizontal antenna feed terminals whereas the second set includes each of the vertical antenna feed terminals, the first set may include both antenna feed terminals for one antenna in phased antenna array 60 whereas the second set includes some or all of the remaining antenna feed terminals in phased antenna array 60, the first set may include all of the horizontal antenna feed terminals in phased antenna array 60 whereas the second set includes only one of the vertical antenna feed terminals in phased antenna array 60, the first set may include only one horizontal antenna feed terminal in phased antenna array 60 whereas the second set includes only one vertical antenna feed terminal in phased antenna array 60, etc. In general, the first and seconds sets for each iteration of steps 172-180 may include any desired combinations of the antenna feed terminals in phased antenna array 60 for transmitting or receiving the radio-frequency signals.

In this way, control circuitry 16 may cycle through multiple different combinations of transmit antenna feed terminals (i.e., antenna feed terminals used in the first set) and receive antenna feed terminals antenna feed terminals used in the second set) in phased antenna array 16 while gathering phase difference values and comparison data values for each combination. This may, for example, allow control circuitry 16 to fully characterize the electromagnetic mutual coupling between different combinations of antennas 40 across phased antenna array 60 (e.g., for detecting the proximity of external object 56 regardless of the precise size or orientation/location of external object 56 relative to phased antenna array 60). Control circuitry 16 may, for example, iterate through steps 172 through 180 for every possible combination of transmit and receive antenna feed terminals in phased antenna array 60 (e.g., given the number of total antenna feed terminals in phased antenna array 60) or may perform these steps for only a subset of every possible combination of transmit and receive antenna feed terminals (e.g., a minimum number of combinations needed to identify the proximity of external object 56 with satisfactory accuracy). When no sets of antenna feed terminals remain, processing may proceed to step 190 as shown by path 188.

At step 190, control circuitry may determine whether predetermined conditions have been satisfied for each of the combinations of first and second sets of antenna feed terminals (e.g., for each iteration of steps 172 through 180) based on the measured phase difference values $\Delta\varphi$ and/or the generated comparison data $\Delta\varphi'$.

As one example, control circuitry 16 may compare each generated comparison data value $\Delta\varphi'$ to a predetermined maximum threshold value. If each of the comparison data values (or a sufficiently small number of the comparison data values) is less than the predetermined maximum threshold value, control circuitry 16 may determine that the predetermined condition is satisfied. Relatively small comparison data values may, for example, be indicative of the wireless performance of phased antenna array 60 being sufficiently similar to a free space scenario, such that control circuitry 16 possesses relatively high confidence that there are no external objects present adjacent to (e.g., within a predetermined distance of) phased antenna array 60. In another suitable arrangement, control circuitry 16 may determine that the predetermined condition is satisfied if an average or other linear combination of the generated comparison data values is less than the predetermined maximum threshold value.

In this example, if one or more of the comparison data values exceeds the predetermined maximum threshold value, control circuitry 16 may determine that the predetermined condition is unsatisfied. An excessively large comparison data value may be indicative of a relatively large phase difference between the corresponding transmit and receive antenna feed terminals relative to the free space environment and thus a relatively large perturbation in the electromagnetic mutual coupling between those transmit and receive antenna feed terminals. Such a perturbation may be indicative of the presence of external object 56 within a predetermined distance from phased antenna array 60 (e.g., at a location 54 adjacent to phased antenna array 60 as shown in FIG. 7)

In another suitable example, control circuitry 16 may determine that predetermined condition is unsatisfied if a selected number of the comparison data values exceed the predetermined maximum threshold value. In another suitable arrangement, control circuitry 16 may determine that the predetermined condition is unsatisfied if a combination (e.g., an average, sum, linear combination, etc.) of the generated comparison data values exceed the predetermined maximum threshold value. The comparison data that is compared to the maximum threshold value may include comparison data generated from one combination of first and second sets of antenna feed terminals (e.g., one iteration of steps 172-180) or from multiple combinations of first and second sets of antenna feed terminals (e.g., multiple iterations of steps 172-180).

If desired, control circuitry 16 may combine other sensor data (e.g., impedance sensor data, capacitive proximity sensor data, image sensor data, light sensor data, etc.) with the measured phase difference values and/or the generated comparison data values to determine whether the predetermined conditions are satisfied. These examples are merely illustrative and, in general, any desired combination of the data gathered while processing one or more iterations of one or more of steps 172-180 may be compared to any desired predetermined conditions to determine whether an external object is in proximity to device 10. If desired, step 178 may be omitted and control circuitry 16 may determine whether an external object is present using only phase difference values and/or sensor data.

If the predetermined conditions are unsatisfied, control circuitry 16 may determine that an external object such as external object 56 is adjacent to (in close proximity to) phased antenna array 60 and device 10 (e.g., within a predetermined distance of phased antenna array 60 such as at location 54 of FIG. 7). Processing may subsequently proceed to step 194 as shown by path 192.

At step 194, control circuitry 16 may take appropriate action to ensure that satisfactory wireless communications are performed by wireless communications circuitry 34 while still satisfying industry or government requirements on absorbed radiation. For example, control circuitry 16 may disable phased antenna array 60 and may switch a different phased antenna array on device 10 into use (e.g., a phased antenna array pointed away from the detected external object). As another example, control circuitry 16 may steer phased antenna array 90 to a different location (e.g., so that the beam of signals handled by phased antenna array 60 is steered around the detected external object). If desired, control circuitry 16 may switch phased antenna array 60 out of use and may switch a different phased antenna array into use in response to determining that phased antenna array 60 is incapable of steering around the detected external object (e.g., in scenarios where the external object is relatively large or located too close to phased antenna array 60). In this scenario, control circuitry 16 may compare the generated comparison data values to first and second threshold values, for example. If the comparison data values exceed the first threshold value but not the second threshold value, this may be indicative of external object 56 being located close enough to phased antenna array 60 that beam steering away from the external object is required but not close enough that phased antenna array 60 needs to be disabled. If the comparison data values exceed the second threshold value, this may be indicative of external object 56 being located too close to phased antenna array 60 to steer around the external object and phased antenna array 60 may be disabled. Other suitable actions may be taken if desired. For example, control circuitry 16 may disable communications at frequencies greater than 10 GHz, may issue an alert to a user of device 10, may issue an alert to other devices, etc.

Phased antenna array 60 may perform object detection using radio-frequency signals transmitted at the reduced power level because the radio-frequency signals need not be conveyed to external wireless equipment and need only be received by other antennas that are within the same antenna array and thus in close proximity to the transmit antennas. The reduced power level may help to ensure that device 10 continues to satisfy government and industry standards on absorbed radiation even if external object 56 (e.g., part of the user's body) is present adjacent to phased antenna array 60. If desired, processing may loop back to step 170 after a predetermined amount of time or periodically so that phased antenna array 60 may determine whether the external object is still adjacent to phased antenna array 60 or whether the external object has moved away from device 10.

If the predetermined conditions are satisfied while processing step 190, control circuitry 16 may determine that no external objects are adjacent to phased antenna array 60 (e.g., that any potential external objects are farther than a predetermined distance away from device 10). Processing may subsequently proceed to step 198 as shown by path 196.

At step 198, control circuitry 16 may enter the wireless communications mode of operation. Control circuitry 16 may subsequently perform wireless communications using the increased transmit power level. For example, control circuitry 16 may exchange wireless data with external wireless equipment using greater transmit power levels than are used while in the proximity detection mode of operation. The increased transmit power level may allow phased antenna array 60 to maintain a satisfactory wireless link quality with the external wireless device. Because external objects are not located within the vicinity of phased antenna array 60, phased antenna array 60 may perform wireless communications using the increased transmit power level while satisfying government and industry standards on absorbed radiation. If desired, processing may loop back to step 170 after a predetermined amount of time, periodically, or in response to a software trigger so that phased antenna array 60 may continue to monitor for the presence of external objects adjacent to phased antenna array 60 over time. In this way, phased antenna array 60 may maintain a satisfactory wireless link with external wireless equipment at frequencies greater than 10 GHz while still ensuring that government and industry standards on absorbed radiation are satisfied. Device 10 need not include other bulky or processing-intensive sensor circuitry for detecting the proximity of external objects with respect to phased antenna array 60.

The example of FIG. 8 is merely illustrative. In another suitable arrangement, control circuitry 16 may determine whether the predetermined conditions are satisfied for each combination of first and second sets of antenna feed terminals before a new combination of first and second sets is selected (e.g., steps 180 and 184 may be performed after step 190 of FIG. 8 if desired). In this scenario, control circuitry 16 may proactively proceed to step 194 if an external object is detected using the phased differences and/or comparison data generated for a given combination of first and second sets of antenna feed terminals without expending further time or resources characterizing additional combinations of first and second sets.

Control circuitry 16 (FIG. 6) may be configured to perform these operations (e.g., the operations of FIG. 8) using hardware (e.g., dedicated hardware or circuitry) and/or software (e.g., code that runs on the hardware of device 10). Software code for performing these operations is stored on non-transitory computer readable storage media (e.g., tangible computer readable storage media). The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, other computer readable media, or combinations of these computer readable media or other storage. Software stored on the non-transitory computer readable storage media may be executed on the processing circuitry of control circuitry 16. The processing circuitry may include application-specific integrated circuits with processing circuitry, one or more microprocessors, or other processing circuitry.

FIG. 9 a table showing how phase difference values and comparison data values may be generated over time for phased antenna array 60 in one illustrative example. In the example of FIG. 9, the first set of antenna feed terminals includes only antenna feed terminal 96-1V and the second set of antenna feed terminals includes only antenna feed terminals 96-2V, 96-3V, and 96-4V.

Row 200 of FIG. 9 shows free space phase difference values $\Delta\varphi FS$ (in degrees) relative to antenna feed terminal 96-1V, For example, in a free space environment (e.g., during calibration of device 10), antenna feed terminal 96-1V exhibits a zero-degree phase difference with respect to itself, whereas antenna feed terminal 96-2V exhibits a 20-degree phase difference, antenna feed terminal 96-3V exhibits a 40-degree phase difference, and antenna feed terminal 96-4V exhibits a 60-degree phase difference with respect to antenna feed terminal 96-1V.

After device 10 has been manufactured and tested, device 10 may the enter proximity detection mode (e.g., while processing step 170 of FIG. 8). Antenna feed terminal 96-1V transmit radio-frequency signals with a known phase (e.g., while processing step 172 of FIG. 8). Antenna feed terminals 96-2V, 96-3V, and 96-4V may receive the transmitted radio-frequency signals (e.g., while processing step 174 of FIG. 8). Control circuitry 16 may measure the phase of the radio-frequency signals received by antenna feed terminals 96-2V, 96-3V, and 96-4V and may subtract the measured phases from the known phase of the radio-frequency signals transmitted by antenna feed terminal 96-1V to obtain phase difference values 41 (row 202). In the example of FIG. 9, antenna feed terminal 96-1V exhibits a zero-degree phase difference with respect to itself, whereas antenna feed terminal 96-2V exhibits a 30-degree phase difference, antenna feed terminal 96-3V exhibits a 40-degree phase difference, and antenna feed terminal 96-4V exhibits a 60-degree phase difference with respect to antenna feed terminal 96-1V.

Control circuitry 16 may compute the difference between the values in row 202 (i.e., the generated phase difference values) and the values in row 200 (i.e., the predetermined free space phase difference values) to generate comparison data values $\Delta\varphi1'$ (row 204). As shown in row 204 of FIG. 9, control circuitry 16 may generate comparison data values of zero for each antenna feed terminal except for antenna feed terminal 96-2V in this example, which exhibits 10 degrees of greater phase difference relative to antenna teed terminal 96-1V than in the free space scenario.

If desired, control circuitry 16 may select a new combination of first and second sets of antenna feed terminals for characterization (e.g., while processing step 184 of FIG. 8) and may continue to iterate through combinations of transmit and receive antenna feed terminals until control circuitry 16 detects an external object in adjacent to phased antenna array 60 (e.g., within a predetermined distance) or until control circuitry 16 determines that no external object is present adjacent to phased antenna array 60.

In another suitable arrangement, control circuitry 16 may use the comparison data values in row 204 to determine whether predetermined conditions indicative of the absence of external object 56 have been satisfied (e.g., at step 190 of FIG. 8 in scenarios where steps 180 and 184 are performed after step 190). In this scenario, control circuitry 16 may compare the information in row 204 to a maximum comparison data threshold value to determine whether an external object is located adjacent to phased antenna array 60 (e.g., while processing step 190 of FIG. 8). In general, greater maximum comparison data threshold values may eliminate more false positives than lower maximum comparison data threshold values and lower maximum comparison data threshold values may be more sensitive to external objects than greater maximum comparison data threshold values. If 10 degrees is greater than the maximum threshold value, this may indicate the presence of external object 56 adjacent to (e.g., within a predetermined distance of) phased antenna array 60 (e.g., where external object 56 has sufficiently altered mutual coupling 142 between antennas 40-1 and 40-2 as shown in FIG. 7). If control circuitry 16 detects the presence of external object 56 adjacent to phased antenna array 60, a different phased antenna array may be used for communications (e.g., while processing step 194 of FIG. 8). If 10 degrees is less than a maximum threshold value, control circuitry 16 may determine that no external object is present adjacent to phased antenna array 60 and the device may enter the communications mode of operation (e.g., while processing step 198 of FIG. 8).

Once device 10 has been placed into the communications mode of operation, device 10 may return to the proximity detection mode of operation after a predetermined amount of time has passed so that phased antenna array 60 may continue to monitor its surroundings for the proximity of external objects (e.g., returning to step 170 of FIG. 8). Row 206 of FIG. 9 shows additional phase difference values Δφ2 that may be generated by control circuitry 16 after device 10 has returned to the proximity detection mode of operation (e.g., assuming the first set of antenna feed terminals still includes only antenna feed terminal 96-1V and the second set of antenna feed terminals still includes only antenna feed terminals 96-2V, 96-3V, and 96-4V). In this iteration, the received radio-frequency signals may exhibit a greater phase difference for some of the antenna feeds than when the data in row 202 was generated (e.g., because external object 56 has moved closer to phased antenna array 60). For example, the radio-frequency signals received by antenna feed terminal 96-2V may exhibit a phase difference of 40 degrees with respect to the transmitted radio-frequency signals and the radio-frequency signals received by antenna feed terminal 96-2V may exhibit a phase difference of 50 degrees with respect to the transmitted radio-frequency signals.

Row 208 of FIG. 9 shows comparison data values Δφ2' that control circuitry 16 may generate by subtracting the values in row 200 from the values in row 206. As shown in row 208, control circuitry 16 may generate comparison data values of zero for each antenna feed terminal except for antenna feed terminal 96-2V, which exhibits 20 degrees of greater phase difference relative to antenna feed terminal 96-1V than in free space, and antenna feed terminal 96-3V, which exhibits 10 degrees of greater phase difference relative to antenna feed terminal 96-1V than in free space. These values may be used to determine whether predetermined conditions indicative of the absence of external object 56 adjacent to phased antenna array 60 have been satisfied (e.g., while processing step 190 of FIG. 8).

For example, if the predetermined maximum threshold value for comparison data is 15, control circuitry 16 may determine that the predetermined conditions are unsatisfied (i.e., because the comparison data value of 20 degrees associated with antenna feed terminal 96-2V is greater than this threshold). Control circuitry 16 may therefore determine that an external object is located adjacent to phased antenna array 60. If the predetermined conditions require a zero-degree comparison data value for antenna feed terminal 96-3V, control circuitry 16 may also determine that an external object is located adjacent to phased antenna array 60 in this example.

FIG. 9 is a simplified example of one particular arrangement and is merely illustrative of some processing operations that may be performed while processing the steps of FIG. 8. In general, the first and second sets of antenna feed terminals may include any desired horizontal and/or vertical antenna feeds from phased antenna array 60. The actual phase difference values shown in FIG. 9 will typically vary in practice (e.g., based on the geometry of phased antenna array 60, the frequencies used, environmental conditions, etc.). Any desired combination of the comparison data values shown in rows 202 and 208 may be compared to any desired predetermined conditions (e.g., one or more threshold values) to determine whether an external object has approached phased antenna array 60 within a predetermined distance (e.g., while processing stop 190 of FIG. 8). Additional data such as sensor data may also be used to determine whether the predetermined conditions have been satisfied. Phased antenna array 60 may include any desired number of antennas each having any desired number of antenna feed terminals for handling radio-frequency signals of any desired polarizations.

The foregoing is merely illustrative and various modifications can be made to the described embodiments. The foregoing embodiments may be implemented individually or in any combination.

What is claimed is:

1. An electronic device, comprising:
   a housing;
   transceiver circuitry in the housing and configured to generate radio-frequency signals at a frequency greater than 10 GHz;
   a phased antenna array in the housing and comprising first, second, and third antenna feeds coupled to the transceiver circuitry, wherein the first antenna feed is configured to transmit the radio-frequency signals at a predetermined phase and the second and third antenna feeds are configured to receive the radio-frequency signals transmitted by the first antenna feed; and
   control circuitry in the housing, wherein the control circuitry is configured to:
   gather a first phase measurement value from the radio-frequency signals received by the second antenna feed and a second phase measurement value from the radio-frequency signals received by the third antenna feed, and
   detect proximity of an object external to the housing based on a first difference between the predetermined phase and the first phase measurement value and a second difference between the predetermined phase and the second phase measurement value.

2. The electronic device defined in claim 1, wherein the phased antenna array comprises first and second antennas, the first antenna feed is coupled to the first antenna, and the second antenna feed is coupled to the second antenna.

3. The electronic device defined in claim 2, wherein the phased antenna array comprises a third antenna, the third antenna feed being coupled to the third antenna.

4. The electronic device defined in claim 2, wherein the second and third antenna feeds cover orthogonal polarizations and the third antenna feed is coupled to the second antenna.

5. The electronic device defined in claim 4, wherein the orthogonal polarizations comprise vertical and horizontal linear polarizations, the transceiver circuitry comprising a vertical polarization transceiver coupled to the second antenna feed and a horizontal polarization transceiver coupled to the third antenna feed.

6. The electronic device defined in claim 1, further comprising:
   switching circuitry coupled between the phased antenna array and the transceiver circuitry, wherein the control circuitry is configured to:
   control the switching circuitry to configure the second antenna feed to transmit the radio-frequency signals and to configure the first antenna feed to receive the radio-frequency signals transmitted by the second antenna feed,
   gather an additional phase measurement value from the radio-frequency signals received by the first antenna feed, and
   detect the proximity of the object based on the gathered additional phase measurement value.

7. The electronic device defined in claim 1, further comprising:
   beam steering circuitry coupled to first antenna feed, wherein the control circuitry is configured to:
   control the beam steering circuitry to transmit the radio-frequency signals at a predetermined phase using the first antenna feed, and
   identify a phase difference value between the predetermined phase and the gathered phase measurement value.

8. The electronic device defined in claim 7, wherein the control circuitry is configured to:
   generate a comparison value by computing a difference between the identified phase difference value and a predetermined phase difference value; and
   compare the generated comparison value to a predetermined maximum threshold value.

9. The electronic device defined in claim 8, wherein the control circuitry is configured to disable the phased antenna array in response to determining that the generated comparison value exceeds the predetermined maximum threshold value.

10. The electronic device defined in claim 9, wherein the first antenna feed is configured to transmit the radio-frequency signals at a first power level and the control circuitry is further configured to:
    control the first antenna feed to transmit the radio-frequency signals at a second power level that is greater than the first power level in response to determining that the generated comparison value does not exceed the predetermined maximum threshold value.

11. The electronic device defined in claim 1, further comprising:
    sensor circuitry configured to generate sensor data, wherein the control circuitry is configured to perform the external object detection operations based on the sensor data.

12. An electronic device, comprising:
    wireless communications circuitry configured to perform cellular telephone communications, the wireless communications circuitry including transceiver circuitry and a phased antenna array coupled to the transceiver circuitry, wherein the transceiver circuitry is configured to transmit radio-frequency signals at a frequency between 10 GHz and 300 GHz; and
    control circuitry coupled to the wireless communications circuitry, wherein the control circuitry is configured to:
    control the wireless communications circuitry to transmit the radio-frequency signals over a first set of antenna feeds in the phased antenna array using a selected phase,
    control the wireless communications circuitry to receive the radio-frequency signals transmitted by the first set of antenna feeds using a second set of antenna feeds in the phased antenna array that is different from the first set of antenna feeds,
    identify a phase difference value between the radio-frequency signals received using the second set of antenna feeds and the selected phase used to transmit the radio-frequency signals over the first set of antenna feeds, and
    determine whether a difference between the generated phase difference value and a calibrated phase difference value exceeds a threshold value, wherein the calibrated phase difference value is associated with an absence of an external object.

13. The electronic device defined in claim 12, wherein the control circuitry is configured to disable the phased antenna array in response to determining that the difference between the generated phase difference value and the calibrated phase difference value exceeds the threshold value.

14. The electronic device defined in claim 13, wherein the wireless communications circuitry further comprises:
    an additional phased antenna array coupled to the transceiver circuitry, wherein the control circuitry is configured to control the wireless communications circuitry to transmit the radio-frequency signals over the additional phased antenna array in response to determining that the difference between the generated phase difference value and the calibrated phase difference value exceeds the threshold value.

15. The electronic device defined in claim 13, wherein the wireless communications circuitry is configured to transmit the radio-frequency signals at a transmit power level and the control circuitry is further configured to control the wireless communications circuitry to increase the transmit power level in response to determining that the difference between the generated phase difference value and the calibrated phase difference value is less than the threshold value.

16. The electronic device defined in claim 12, wherein the control circuitry is further configured to:
    control the wireless communications circuitry to transmit the radio-frequency signals over a third set of antenna feeds in the phased antenna array using an additional selected phase,
    control the wireless communications circuitry to receive the radio-frequency signals transmitted by the third set of antenna feeds using a fourth set of antenna feeds in the phased antenna array,
    identify an additional phase difference value between the radio-frequency signals received using the fourth set of antenna feeds and the selected additional phase used to transmit the radio-frequency signals over the third set of antenna feeds, and
    compare the additional phase difference value to an additional calibrated phase difference value.

17. The electronic device defined in claim 12, wherein the first set of antenna feeds comprises a vertically polarized antenna feed and the second set of antenna feeds comprises a horizontally polarized antenna feed.

18. An electronic device comprising:
- a housing having peripheral conductive housing structures;
- a touch screen display mounted to the peripheral conductive housing structures;
- a phased antenna array that is mounted in the housing and that is configured to convey millimeter wave signals;
- beam steering circuitry in the housing and coupled to the phased antenna array, wherein the beam steering circuitry is configured to control the phased antenna array to transmit the millimeter wave signals with a selected phase;
- transceiver circuitry in the housing and configured to use the phased antenna array to receive the millimeter wave signals transmitted by the phased antenna array;
- phase measurement circuitry configured to perform a phase measurement on the millimeter wave signals received using the phased antenna array; and
- control circuitry in the housing, wherein the control circuitry is configured to:
  - identify a phase difference between the phase measurement performed by the phase measurement circuitry and the selected phase, and
  - perform external object proximity detection operations based on the identified phase difference.

19. The electronic device defined in claim 1, wherein the transceiver circuitry includes cellular telephone transceiver circuitry.

* * * * *